United States Patent
Li et al.

(10) Patent No.: US 11,877,458 B2
(45) Date of Patent: Jan. 16, 2024

(54) RRAM STRUCTURES IN THE BEOL

(71) Applicant: International Business Machines Corporation, Armonk, NY (US)

(72) Inventors: Baozhen Li, South Burlington, VT (US); Chih-Chao Yang, Glenmont, NY (US); Barry Linder, Hastings-on-Hudson, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/813,166

(22) Filed: Mar. 9, 2020

(65) Prior Publication Data

US 2021/0280638 A1 Sep. 9, 2021

(51) Int. Cl.
| | | |
|---|---|---|
| *H01L 45/00* | (2006.01) | |
| *H10B 63/00* | (2023.01) | |
| *H10N 70/20* | (2023.01) | |
| *H10N 70/00* | (2023.01) | |
| *G06N 3/04* | (2023.01) | |
| *G06N 3/063* | (2023.01) | |

(52) U.S. Cl.
CPC ........... *H10B 63/80* (2023.02); *H10N 70/066* (2023.02); *H10N 70/24* (2023.02); *H10N 70/841* (2023.02); *H10N 70/8833* (2023.02); *G06N 3/04* (2013.01); *G06N 3/063* (2013.01)

(58) Field of Classification Search
CPC .. H01L 45/1226; H01L 45/124; H10N 70/823
See application file for complete search history.

(56) References Cited

U.S. PATENT DOCUMENTS

| | | | |
|---|---|---|---|
| 8,206,995 B2 | 6/2012 | Reyes et al. | |
| 9,178,144 B1 | 11/2015 | Sung et al. | |
| 9,257,642 B1 | 2/2016 | Chang et al. | |
| 9,349,950 B2 | 5/2016 | Walls | |
| 9,865,653 B2 | 1/2018 | Liu et al. | |
| 9,893,278 B1 | 2/2018 | Chuang et al. | |
| 10,290,801 B2 * | 5/2019 | Narayanan | H01L 27/2436 |

FOREIGN PATENT DOCUMENTS

WO WO2018004588 1/2018

* cited by examiner

*Primary Examiner* — Mark V Prenty
(74) *Attorney, Agent, or Firm* — L. Jeffrey Kelly

(57) ABSTRACT

A Resistive Random-Access Memory (RRAM) has an internal electrode; a high k dielectric layer surrounding and in contact with the internal electrode; a lower substrate; and a trench having three or more trench sides disposed within the lower substrate; and one or more interconnects each with an interconnect side. The interconnect side forms part of one of the trench sides. The internal electrode and the high k dielectric layer are disposed within the trench with the interconnect side in contact with the high k dielectric layer. In some embodiments, an external electrode is between and electrically connected to the high k dielectric layer and the internal electrode. The external electrode then forms the electrical connection between the high k dielectric and the interconnect side. Multiple embodiments are disclosed including RRAMs created in multiple substrates; different RRAM configurations; and dual, three-wire RRAMs with two interconnects. Arrays of RRAMs and methods of making are also disclosed.

9 Claims, 19 Drawing Sheets

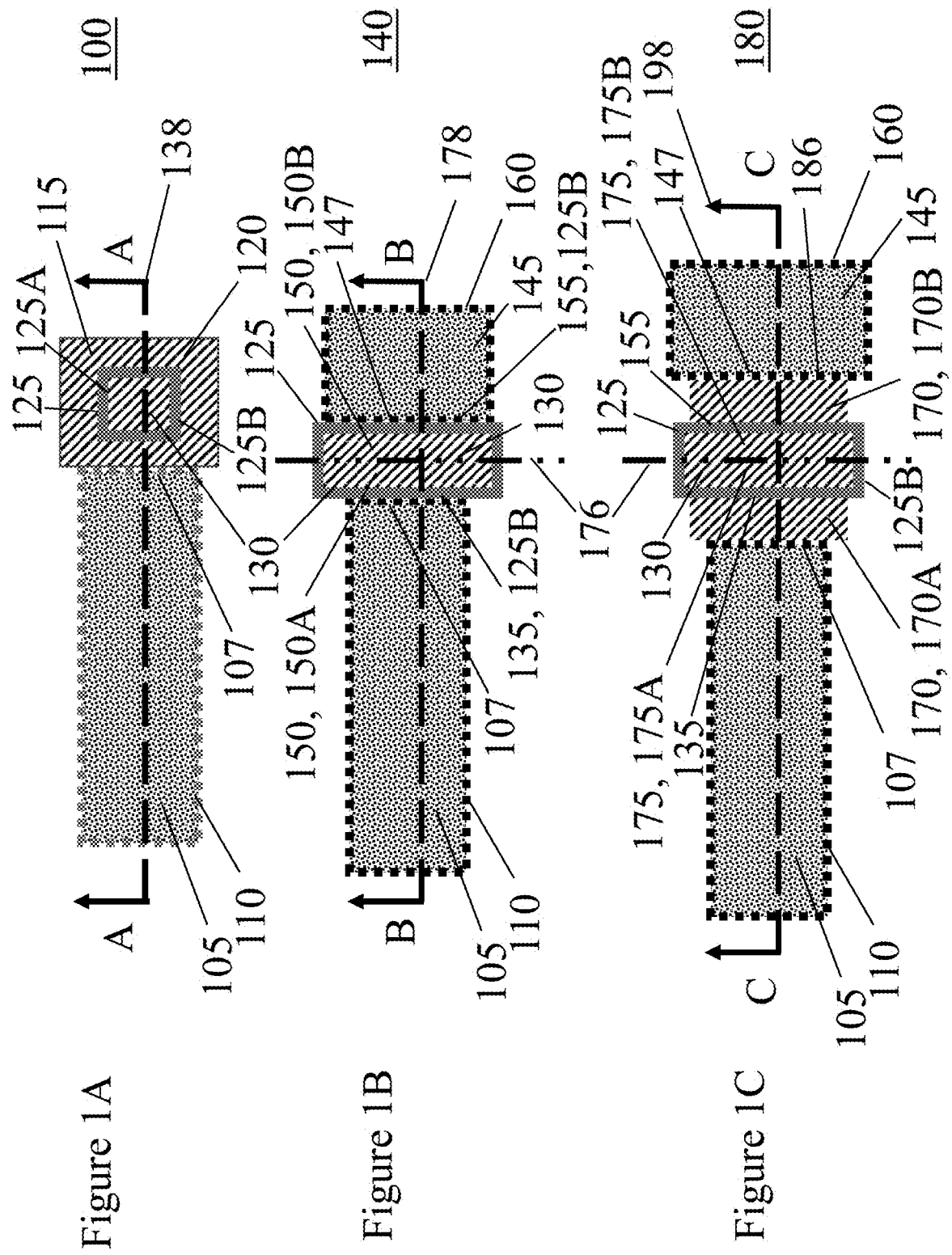

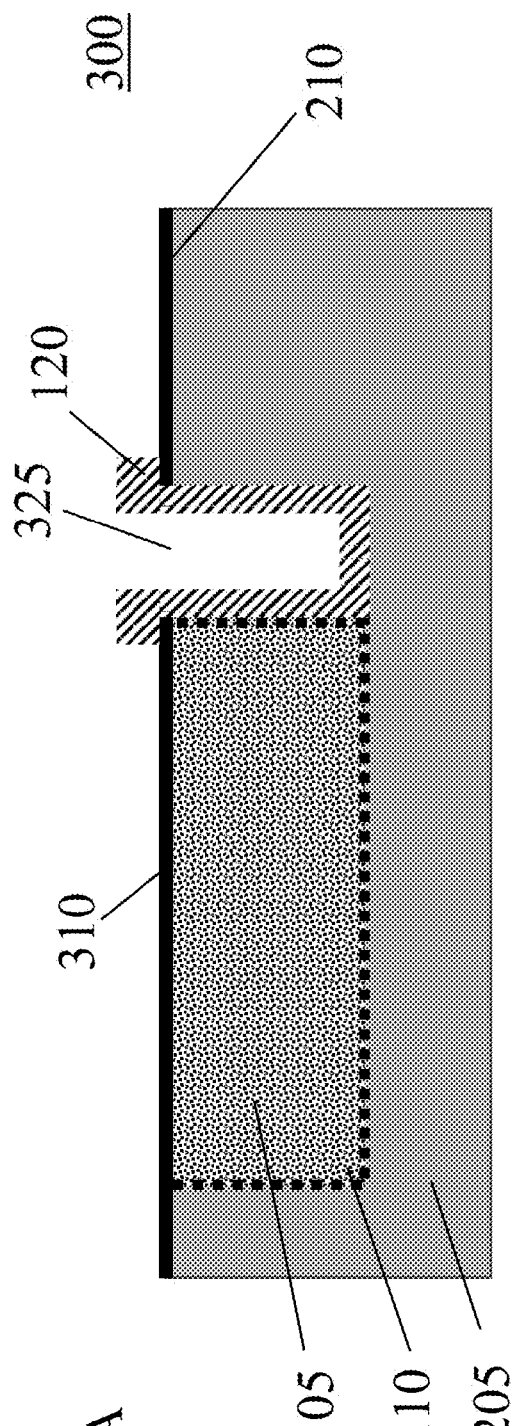
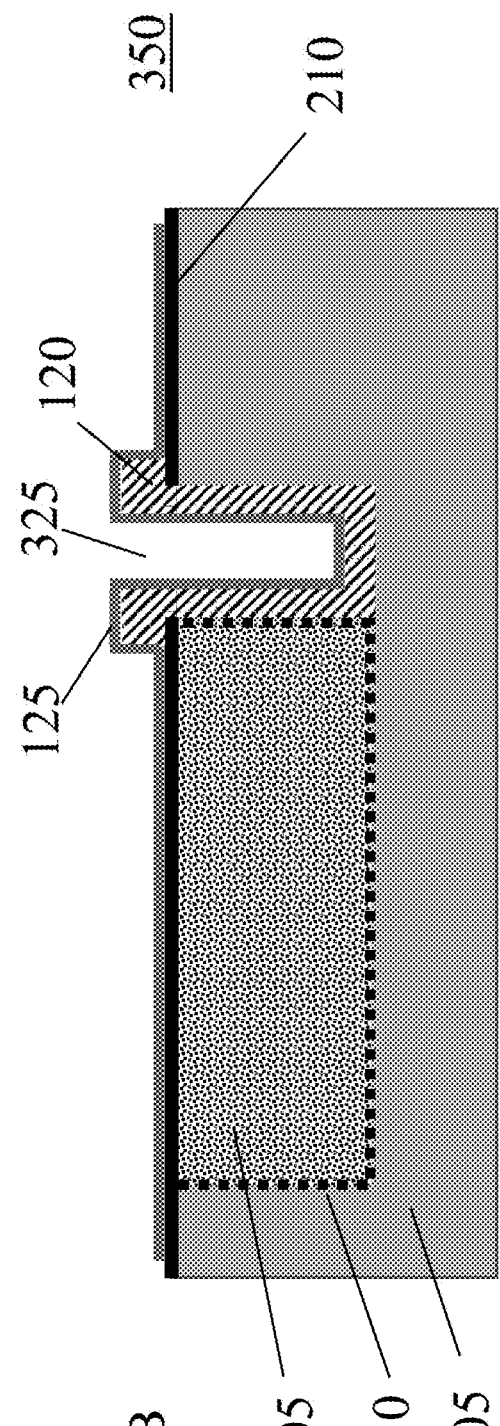
Figure 3A
Figure 3B

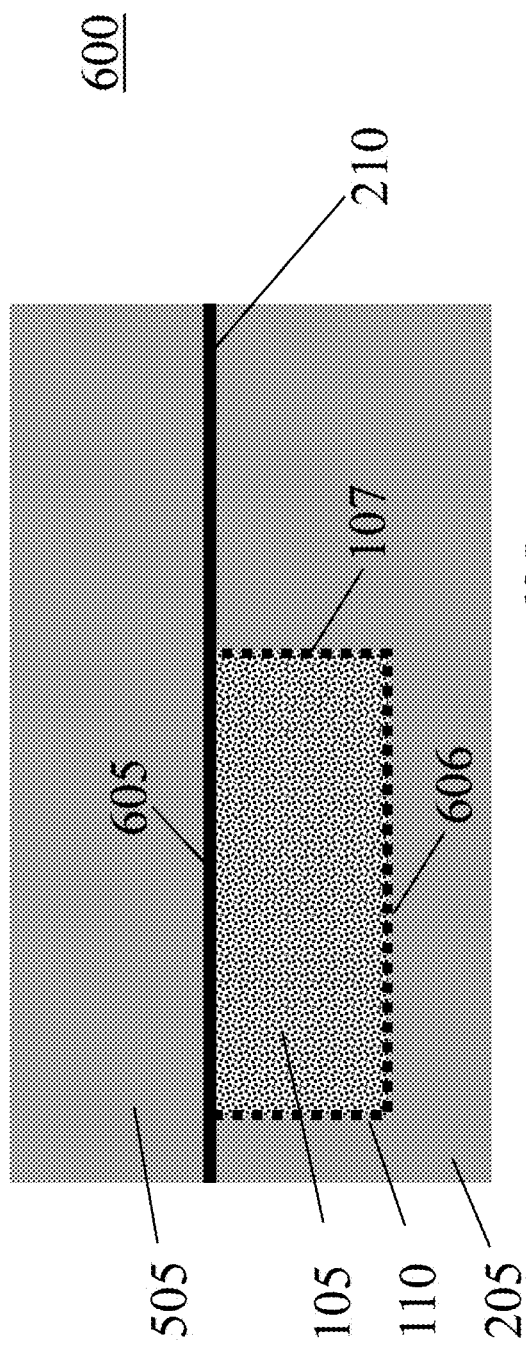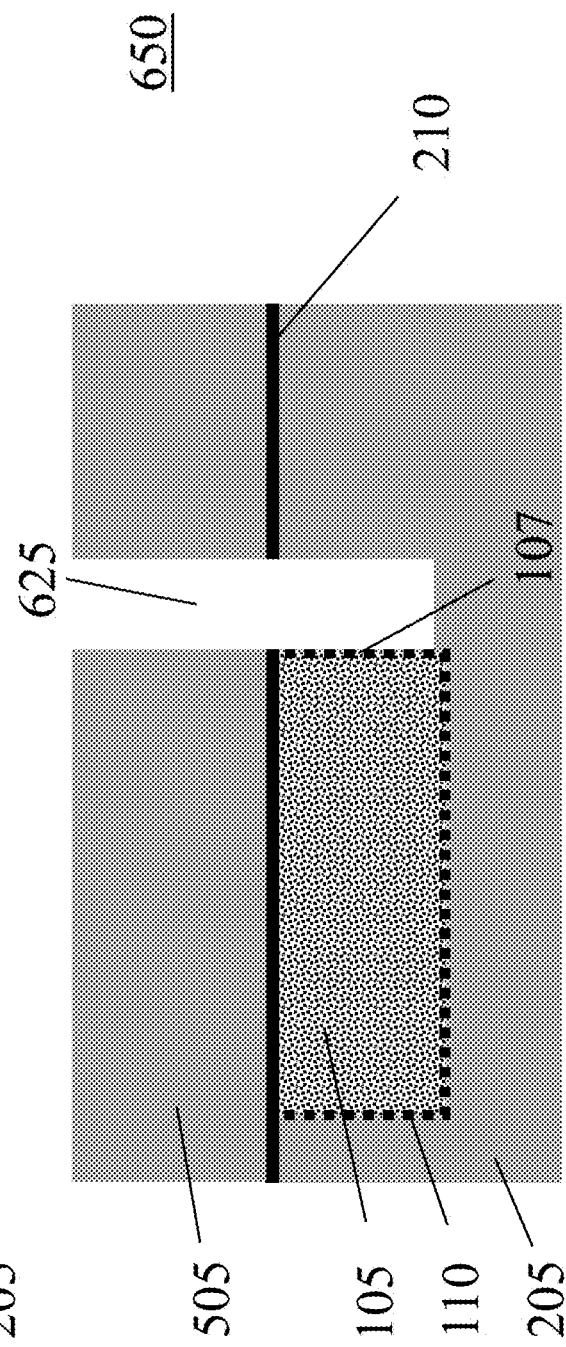
Figure 6A
Figure 6B

- Passing a Trench Though Substrates 1905
- Depositing External Electrodes (optional) 1910
- Depositing High k Layer 1915
- Depositing Internal Electrodes 1920
- Making Electrode Connections 1925
- Making Array Connections 1930

RRAM STRUCTURES IN THE BEOL

BACKGROUND

The present invention relates to Resistive Random-Access Memory (RRAM), and more specifically, to RRAM embodiments built in the Back End of the Line (BEOL).

A dielectric, which is normally insulating, can be made to conduct (in a low resistance state (LRS)) through one or more filaments or conduction paths formed by application of a sufficiently high voltage. Once the filament/path is formed, a voltage change can "reset" the dielectric (e.g. break the filament/path resulting in high resistance state (HRS)) or "set" (re-form the filament/path resulting in lower resistance) the dielectric. It is also possible to form/store intermediate states between LRS and HRS by changing the configuration of filaments via electrical bias.

RRAM can have a polarity that is either unipolar or bipolar. Unipolar devices switch depending on a magnitude of voltage applied. On the other hand, bipolar devices require the applied voltage to reverse polarity to switch. For example, bipolar devices need a polarity reversal when switching from set to reset while unipolar devices do not need a change in polarity when switching.

RRAM is considered as a promising technology for electronic synapse devices or memristors used in neuromorphic computing as well as for high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully connected neural network.

Making RRAM devices in the BEOL presents challenges. While device circuitry is generally placed in lower levels of circuitry in the front end of the line (FEOL) processes, the BEOL typically has multiple electrically conductive (e.g. metallic) interconnects in upper levels of the circuitry providing signal, information, control, and power between and among the devices and components.

There are multiple layers formed in the BEOL. Some of these layers contain connections that perform specific functions. For example, some layers, like the connection layers, in the BEOL contain wires or connections that remain within the layers, e.g. running inside a horizontally layer. Other layers, like the via layers, have vertical connections, e.g. vias, passing vertically through the via layers to interconnect between horizontal connections in different horizontal layers.

Depending on the layer, layers can have different thicknesses, carry interconnections performing different purposes, and have interconnections with different pitch.

For example, in some designs, a layer primarily containing signal, information, odor control interconnections will have finer interconnections with a lower pitch and will be at a lower level in the structure to be closer to devices in devices layers built in the FEOL. (These thin layers also have nets to supply power to the FEOL devices.) These signal interconnections can be finer and shorter without incurring large resistive operating losses.

Thicker,% larger connections distribute power and generally are placed in upper level layers. The power connections are larger to reduce the resistive operating losses that can occur at the higher current loads. These power distribution layers have interconnections with lower density because the power interconnections are larger. The power distribution layers also tend to be thicker.

The via layers, or layers contain vertical vias interconnecting horizontal interconnections and/or components in different layers, tend to be thinner than the horizontal connector layers. Having thinner via layers reduces the resistive power losses. In addition, having thinner via layers reduces the overall thickness of the circuitry. However, because the via layers are thinner, it is more difficult to fit taller components within these via layers.

In other words, lower level interconnects (closer to FEOL devices) need a high density to connect the devices for signal and power. These lines and vias are thinner and have tighter pitches; mostly used for the so-called "local interconnects". In the upper levels, signals and power need to travel longer distances, so density is not as important as resistance. Therefore, these upper levels are thicker and have larger interconnect pitches. (These interconnects are so-called "global interconnects".)

Since the vias are so short in the lower thin levels, process limitations currently make inserting RRAMS in those levels not feasible. Therefore, inserting RRAMs in the upper thick metal levels is the current practice. However due to the large pitches in the upper levels, it is challenging to build high density RRAM arrays in these upper thick metal levels. This problem worsens as RRAM arrays become denser.

Due to these problems, RRAM formation in the BEOL is difficult. As a further example, in typical crossbar designs, a RRAM element will be placed vertically in a via layer between a bottom electrical connection in a bottom layer (e.g. a first horizontal interconnect layer) and a top electrical connection in a top layer (e.g. a second horizontal interconnect layer). Since the via layers are thin, some RRAM structures are too tall to fit in these via layers. This forces RRAM structures (and RRAM arrays) to be placed in the thicker, higher, power connection levels, e.g. in power layers. Again, placing the RRAMs in the power layers limits the density of the RRAM arrays.

In addition, building RRAM in via levels creates manufacturing problems. Finer/smaller dimensions are used in the via level topologies, e.g. on the order of the diameter of a via. Building RRAM in regions with these small dimensions/topologies causes process integration, yield, and reliability difficulties because the tight working room and/or tolerance requirements have a tighter fabrication/process window.

There is a need for structures and methods that enable building RRAMs and higher density RRAM arrays in thinner BEM layers, particularly in BEOL, regions with higher density and tighter pitch interconnections, e.g. in the lower BEOL via layers. There is a need to build better high-density RRAM arrays with cross bar designs in the metal layers built in the BEOL. Improved methods are needed to integrate RRAM array builds in BEM processes and overcome topographical challenges in the RRAM and RRAM array builds.

SUMMARY

Embodiments of the present invention include a Resistive Random-Access Memory (RRAM) with an internal electrode; a high k dielectric layer surrounding and in contact with the internal electrode; a lower substrate; a trench having three or more trench sides disposed within the lower substrate; and one or more interconnects each with an interconnect side. Each of the interconnect sides forms part of one of the trench sides. The internal electrode and the high k dielectric layer are disposed within the trench with the interconnect side in contact with the high k dielectric layer. In some embodiments, an external electrode is between and electrically connected to the high k dielectric layer and the internal electrode. The external electrode then forms the electrical connection between the high k dielectric and the interconnect side.

Multiple embodiments are disclosed including different RRAM configurations and dual, three-wire RRAMs with two interconnects. Arrays of RRAMs and methods of making are also disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 1A is a top down, plan view of one embodiment of a single RRAM adjacent to a single interconnect.

FIG. 1B is a top down, plan view of an alternative embodiment of a dual RRAM between two interconnects where the RRAM has no external contact but uses the abutted interconnect (metal lines) as electrodes.

FIG. 1C is a top down, plan view of an alternative embodiment of a dual RRAM between two interconnects where the RRAM has both an external and internal contact.

FIG. 3A is an elevation cross section view of a preliminary structure after an external contact/electrode deposition, FIG. 3B is an elevation cross section view of a preliminary structure after a high k dielectric deposition.

FIG. 6A is an elevation cross section view of a preliminary structure including a bottom BEOL layer/substrate and a top BEOL layer/substrate with a single interconnect in the bottom BEOL layer.

FIG. 6B is an elevation cross section view of the preliminary structure of FIG. 6A with a trench through the top BEOL layer, disposed into the bottom BEOL layer, and adjacent to a side of the interconnect.

FIG. 19 is a flow chart of a process of making one or more RRAM in the BEOL.

DETAILED DESCRIPTION

Figure 2A:
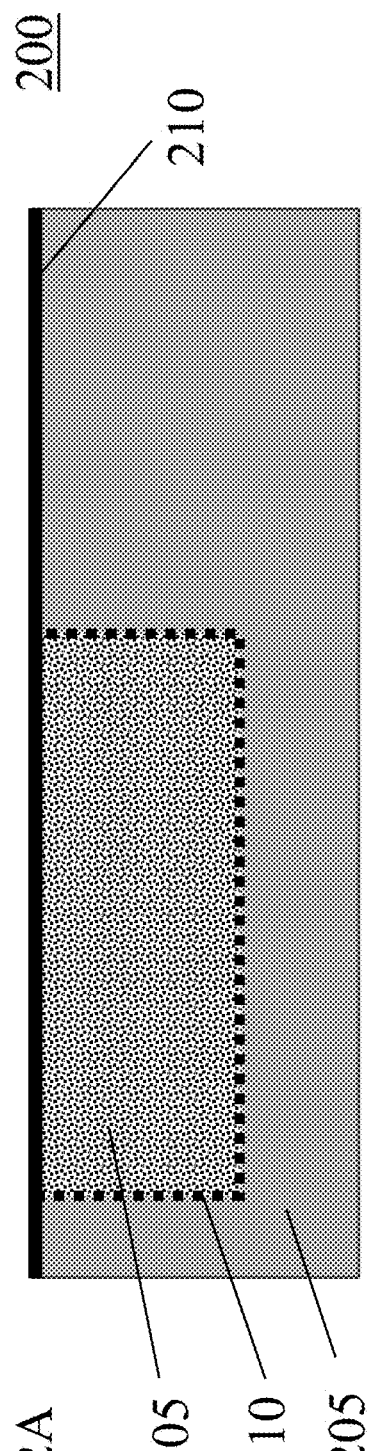
FIG. 2A is an elevation cross section view of a preliminary structure including a substrate and a single interconnect.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the disclosed devices, structures, and methods are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located. Terms such as "thick", "thickness", "thin" or derivatives thereof may be used in place of "height" where indicated.

Conversely, a "depth" refers to a vertical size of an element (e.g., a layer, trench, hole, opening, etc.) in the cross-sectional or elevation views measured from a top surface to a bottom surface of the element.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Refer to the Figures.

FIG. 1A is a top down, plan view of one embodiment 100 of a single IMAM 115 adjacent to a single interconnect 105. An example of this plan cross section is shown as view D-D 538 in FIG. 5.

The interconnect 105 can be any electrically conductive material including but not limited to a conductive paste or a metal. Examples of metal interconnects 105 include materials like copper (Cu), silver (Ag), gold (Au), nickel (Ni), aluminum (Al), cobalt (Co), ruthenium (Ru), tungsten (W), and their combinations or alloys, etc. The interconnects 105 typically are interconnecting lines in horizontal layers of a substrate or circuit package.

Some interconnects 105 are covered with a barrier layer 110. The barrier layer 110 prevents migration of the interconnect 105 material through the barrier layer 110. For example, a copper interconnect 105 can be covered by a Tantalum Nitride (TaN) harrier layer 110 that prevents the migration/diffusion of the copper outside of the interconnect 105 into other components. TaN is deposited by known techniques and depending on the deposition process TaN can have a resistivity that varies from metal to insulator.

In some embodiments, the single RRAM 115 is made of an external contact or electrode 120, a dielectric layer 125, and an internal contact or electrode 130. The dielectric layer has an internal dielectric side 125A and an external dielectric side 1251. In some embodiments, the dielectric layer 125 surrounds some or all the sides of the internal contact 130 and the internal dielectric side 125A is in contact with the internal contact 130. In some embodiments, the external contact 120 surrounds some or all sides of the dielectric layer 125 and the external contact 120 is in contact with the external dielectric side 125B.

In some embodiments, the RRAM 115 is disposed in a trench with a trench side that is adjacent to an interconnect side 107 of the interconnect 105 so that the external contact 120 of the RRAM is in physical and electrical contact with the interconnect side 107. The interconnect side 107 of the interconnect 105 can form part or all of a side of the trench.

The external contact 120 and internal contact 130 of the RRAM 115 are made of an electrically conductive material including but not limited to Titanium Nitride (TiN) and Tantalum Nitride (TaN). Metals can also be used, including but not limited to Cu, Al or W.

The dielectric layer 125 of the RRAM 115 is made of a high-k dielectric material including but not limited to Hafnium Oxide (HfO$_x$), Tantalum Oxide (TaO$_x$), Aluminum Oxide (Al$_2$O$_3$), Zirconium Oxide (ZrO2), and Titanium Oxide (TiO$_x$), Other commonly the high-k dielectric materials may be used.

Figure 4:
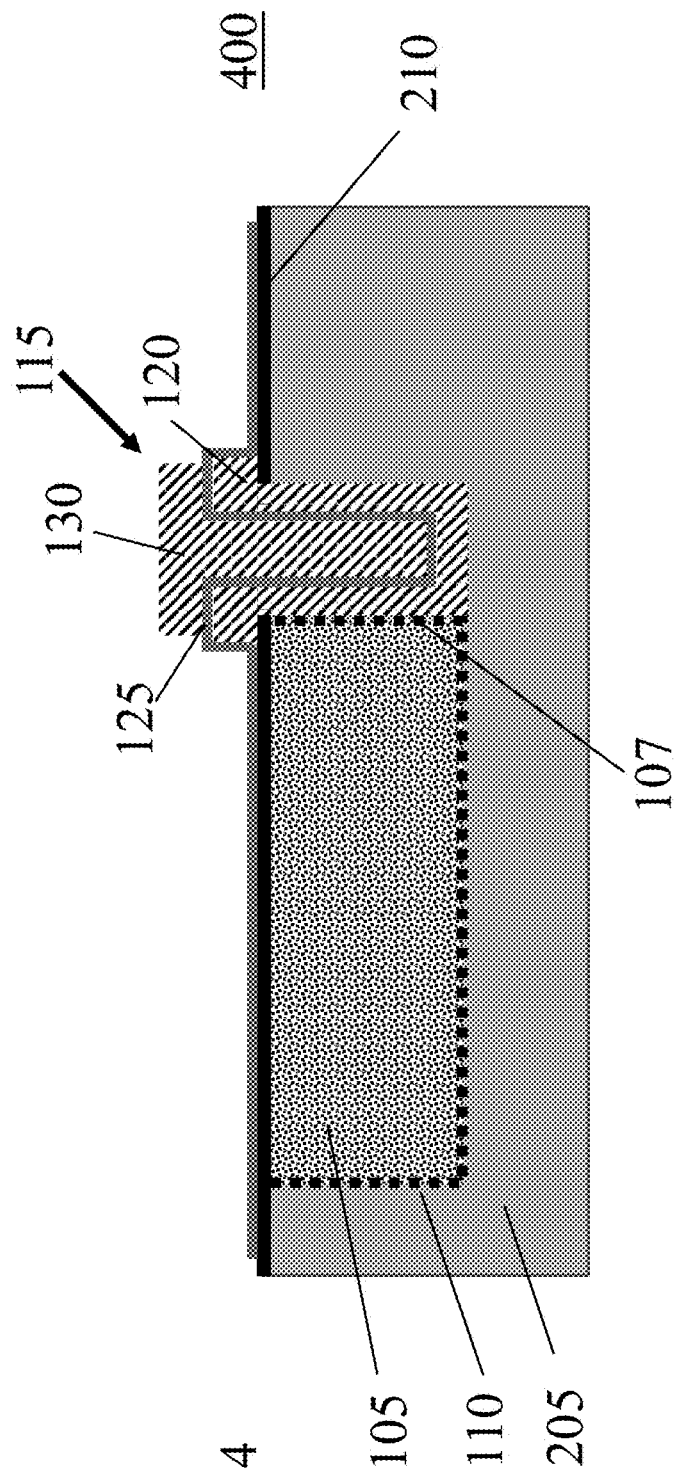
FIG. 4 is an elevation cross section view of a preliminary structure including a substrate and a single interconnect that is adjacent to and in electrical contact with an external contact/contact of a RRAM structure.

An example of the cross-section, elevation view A-A 138 is shown in FIG. 4.

FIG. 1B is a top down, plan view of an alternative embodiment 140 of a dual RRAM (typically 150) between two interconnects (105, 145) where the dual RRAM 150 has no external contact 120. An example of this plan cross section is shown as view 1778 in FIG. 17.

The interconnects (105, 145) can be made of the same conductive materials described above and can have same or similar barrier layers 110.

In this embodiment, a dual RRAM 150 is made of a dielectric layer 125 and an internal contact or electrode 130. In some embodiments, the dielectric layer 125 surrounds some or all the sides of the internal contact 130. The external dielectric side 125B of a first dielectric side 135 of the dielectric layer 125 is electrically and physically connected to first interconnect side 107 of the first interconnect 105.

The external dielectric side 125B of a second dielectric side 155 of the dielectric layer 125 is electrically and physically connected to second interconnect side 147 of the second interconnect 145. In this embodiment, the first 105 and second 145 interconnects form both the function of interconnection and RRAM 150 external contact/electrode 120. In FIG. 1B, the first dielectric side 135 of the dielectric layer 125 is the dielectric layer 125 to the left of the centerline 176 and the second dielectric side 155 of the dielectric layer 125 is to the right of the centerline 176.

In this embodiment, two or dual RRAMs 150 are formed (150A, 150B), one RRAM on each side of the centerline 176. The dual RRAMs 150 share a common internal contact or electrode 130 and are a three contact/electrode device. For example, a voltage can be connected across the first interconnect 105 and the common internal contact 130 that sets/resets the first dielectric side 135 of the dielectric layer 125. Independently, a voltage can be applied across the second interconnect 145 and the common internal contact 130 that sets/resets the second dielectric side 155 of the dielectric layer 125. In this way, the separate RRAMs (150A, 150B) can be independently controlled and read.

Figure 17:
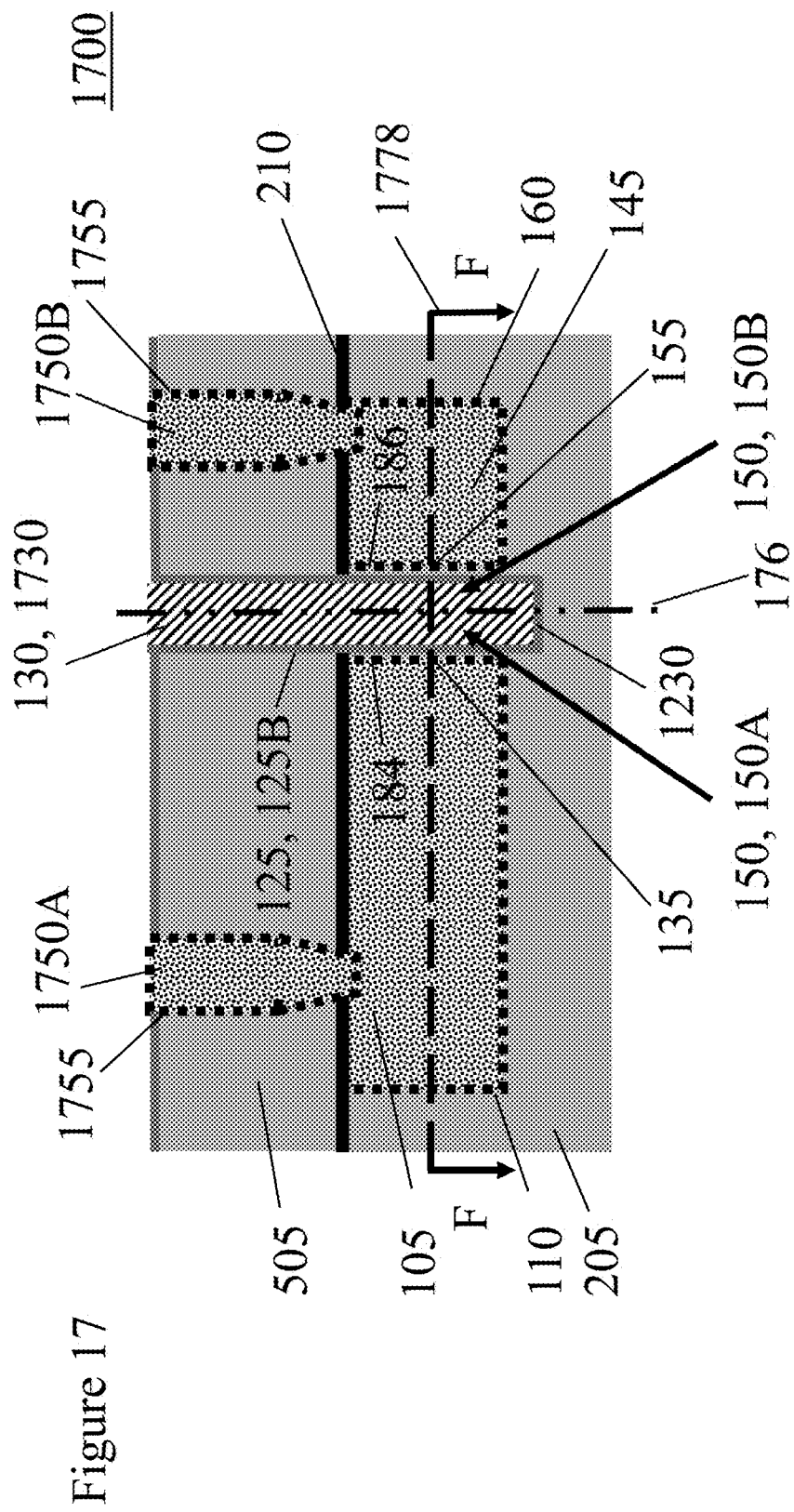
FIG. 17 is an elevation cross section view of another alternative embodiment of a completed dual RRAM with no external contact/electrode and a first interconnect side connected directly to a first high k dielectric side and a second interconnect side connected directly to a second high k dielectric side with a common internal connection/electrode.

An example of the cross-section, elevation view B-B 178 is shown in FIG. 17.

FIG. 1C is a top down, plan view of an alternative embodiment 180 of a dual RRAM 175 between two interconnects (105, 145). The dual RRAM 175 has a first external contact 170A, a second external contact 170B, a dielectric layer 125, and a common internal contact 130 that form a three electrode/connection device 175.

The interconnects (105, 145) can be made of the same conductive materials described above and can have same or similar barrier layers 110.

In this embodiment, the dual RRAM 175 is two RRAMs (175A, 175B) made of a first 170A and second 170B external contact/electrode 170, a dielectric layer 125 and an internal contact or electrode 130. In some embodiments, the dielectric layer 125 surrounds some or all the sides of the internal contact 130. The first 170A and second 170B external contact/electrode 170 are not electrically connected. A first external contact/electrode 170A is electrically and physically connected to first interconnect side 107 of the first interconnect 105 and the external dielectric side 125B of the first dielectric side 135 of the dielectric layer 125. The second external contact/electrode 170B is electrically and physically connected to second interconnect side 147 of the second interconnect 145 and the external dielectric side 125B of the second dielectric side 155 of the dielectric layer 125.

In this embodiment, the two or dual RRAMs 175 (175A, 175B) share a common internal contact or electrode 130 forming a three contact/electrode device with a center line 176. For example, a voltage can be connected across the first interconnect 105 and the common internal contact 130 that sets/resets the first dielectric side 135 of the dielectric layer 125. Independently, a voltage can be applied across the second interconnect 145 and the common internal contact 130 that sets/resets the second dielectric side 155 of the dielectric layer 125. In this way, the separate RRAMs (1751, 175B) can be independently controlled and read.

Figure 15:
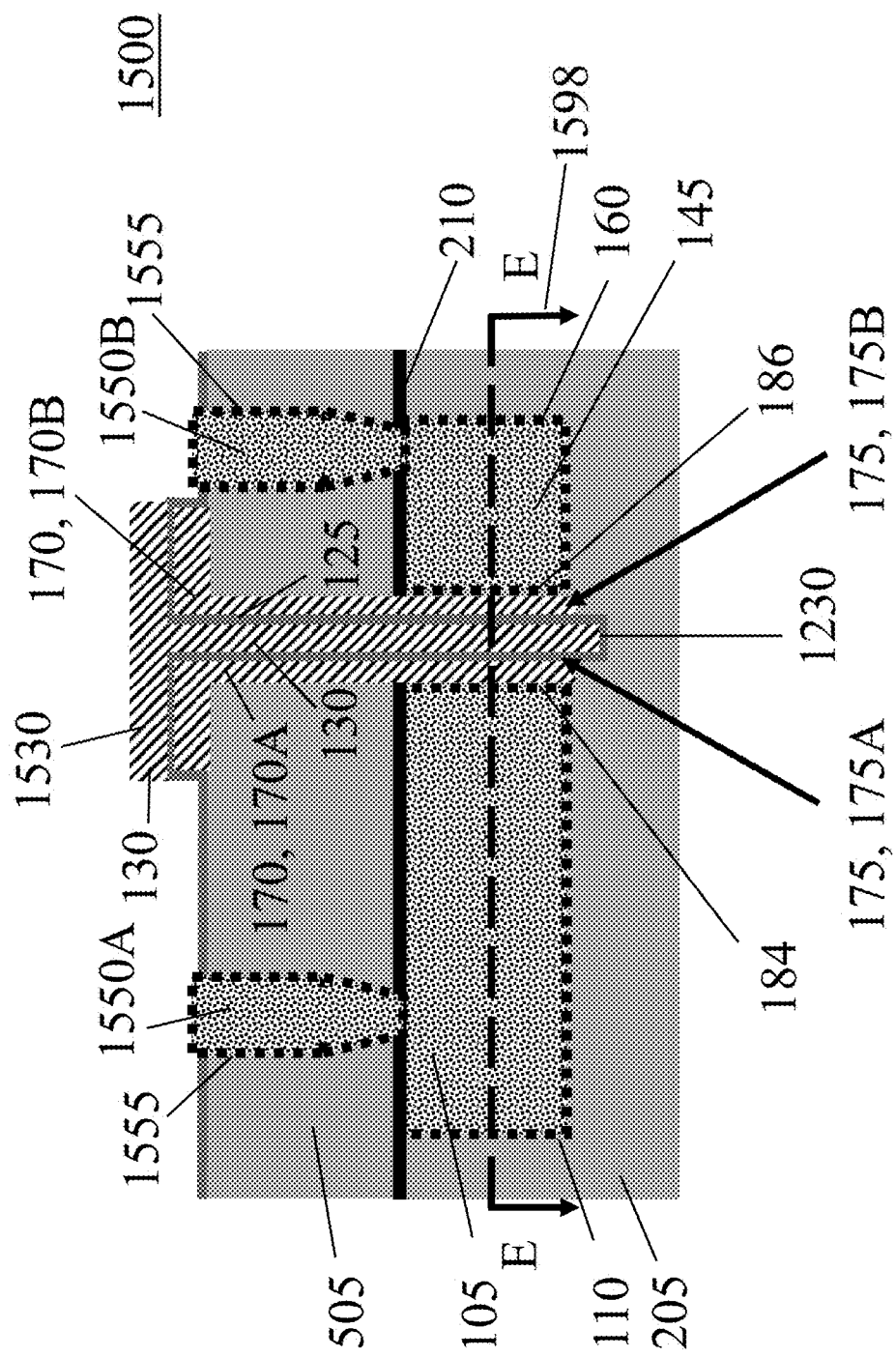
FIG. 15 is an elevation cross section view of one embodiment of a completed dual, three-wire RRAM with an external contact via to each of the first and second interconnect, respectively, and a common internal contact/electrode.

An example of the cross-section, elevation view C-C 198 is shown in FIG. 15.

FIG. 2A is an elevation cross section view of a preliminary structure 200 including a substrate 205 and a single interconnect 105.

The substrate 205 can have a capping layer 210. The capping layer 210 is a dielectric layer that prevents migration of materials from the interconnect 105, e.g. prevents copper migration, and can serve as an etch stop. In some embodiments the capping layer is a Carbon Nitride or a Silicon Nitride, including but not limited to SiCN or SiN.

The substrate 205 is an inter- or intra-level non-conductive dielectric layer. In some embodiments the substrate 205 can be disposed on, not within, a semiconductor substrate (not shown). Some embodiments of the substrate 205 are made from silicon dioxide $SiO_2$, doped $SiO_2$, TEOS (tetraethoxysilane), or any low K dielectric material. In some embodiments, there can be additional layers, not shown, between any semiconductor substrate and the substrate 205.

The substrate 205 can be a layer created in the BEOL. In some embodiments the substrate 205 is between 10 nanometers (nm) and 50 nm thick.

Figure 2B:
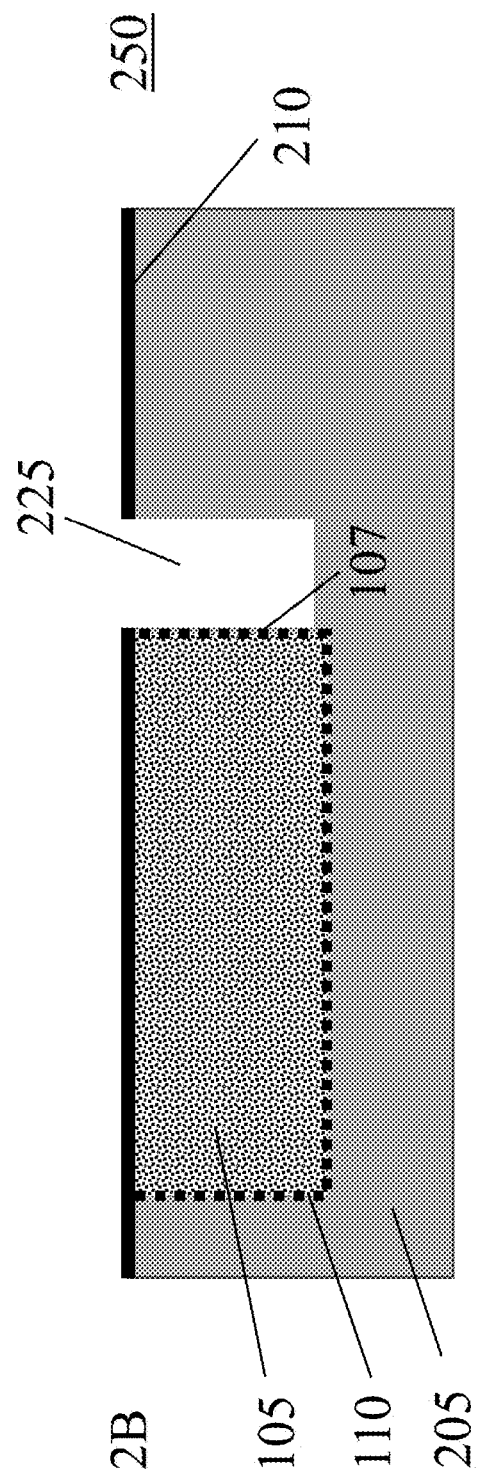
FIG. 2B is an elevation cross section view of a preliminary structure including a substrate and an interconnect with a trench disposed in the substrate adjacent to a side of the interconnect.

FIG. 2B is an elevation cross section view of a preliminary structure 250 including a substrate 205 and an interconnect 105 with a trench 225 disposed within the substrate 250 and adjacent to a side 107 of the interconnect 105. The trench 225 is made with known techniques like an etching or laser ablation process. The trench 225 is positioned to expose the side 107 of the interconnection 105.

FIG. 3A is an elevation cross section view of a preliminary structure 300 after an external contact 120 deposition.

The external contact 120 is made of any of an electrically conductive material, including but not limited to Titanium Nitride (TiN) and Tantalum Nitride (TaN). Metals can also be used, including but not limited to Cu, Al or W. The external contact 120 is deposited by standard conformal deposition techniques including atomic layer deposition (ALD), chemical vapor deposition (CVD), Plasma Enhanced Chemical Vapor Deposition (PECVD), Radio Frequency Chemical Vapor Deposition (RFCVD,) Physical Vapor Deposition (PVD), Pulsed Laser Deposition (PLD), Liquid Source Misted Chemical Deposition (LSMCD), and/or sputtering.

In some embodiments, after deposition of the external contact 120, the material is selectively removed from the surface 310 of the capping layer 210 by known trimming removal or pattern masking techniques.

FIG. 3B is an elevation cross section view of a preliminary structure 350 after a high k dielectric 125 deposition.

As stated above, the dielectric layer 125 is made of a high-k dielectric material including but not limited to Hafnium Oxide ($HfO_x$), Tantalum Oxide ($TaO_x$), Aluminum Oxide ($Al_2O_3$), Zirconium Oxide (ZrO2), and Titanium Oxide ($TiO_x$). Other high-k dielectric materials may be used.

The dielectric layer 125 is deposited by known conformal deposition techniques including but not limited to ALD, CVD, PVD, PECVD, RRCVD, PLD, LSMCD, sputtering, etc.

In some embodiments, the thickness of the dielectric layer 125 is between 1 nm and 10 nm. In some embodiments, a trim step removes the dielectric layer material from the surface 310 of the capping layer 210. This may be done to reduce stray capacitances of the final device.

After deposition of the external contact 120 and the dielectric layer 125, there is a smaller opening 325 remaining in the trench 225.

FIG. 4 is an elevation cross section view of a preliminary structure 400 after an internal contact 130 deposition. The structure includes a substrate 205 and a single interconnect 105 with a single RRAM 115 disposed in the trench 225 adjacent to a side 107 of the interconnect 105.

The internal contact/electrode 130 can be made of the same materials as the external contact/electrode 120 and can be deposited by the same methods. The internal contact/ electrode 130 deposition fills the remaining opening 325 of the trench 225. In some embodiments, the excess internal contact/electrode 130 material deposited on the surface 310 of the capping layer 210 can be removed in a trim step.

The single RRAM 115 build is now complete with components, including the external contact/electrode 120, the dielectric layer 125, and the internal contact/electrode 130.

Figure 5:
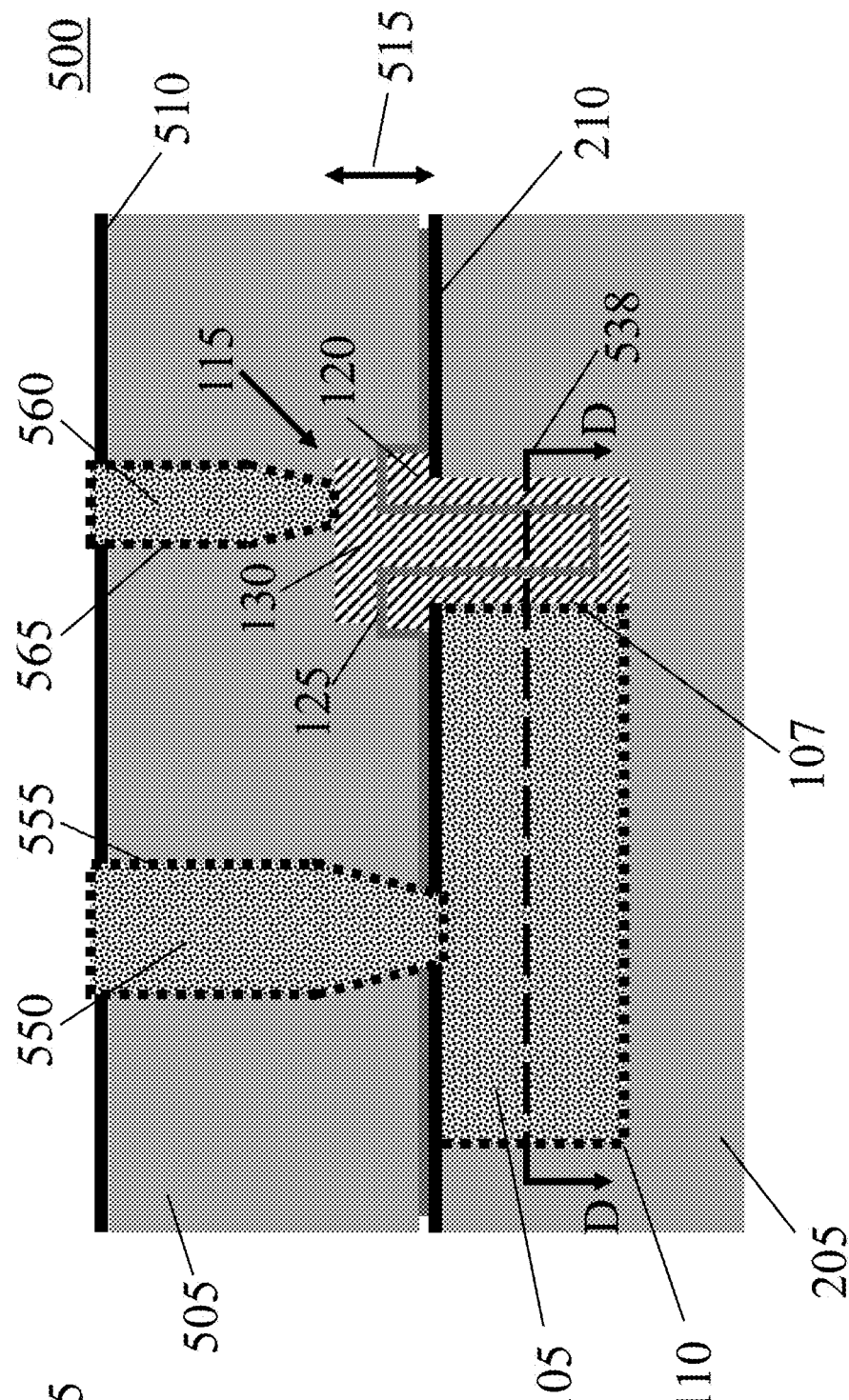
FIG. 5 is an elevation cross section view of one embodiment of a completed single RRAM with an external contact/electrode adjacent and connected to a single interconnect.

FIG. 5 is an elevation cross section view of one embodiment 500 of a completed single RRAM 115 with an external contact 120 adjacent to and connect with the side 107 of the single interconnect 105.

In addition, the embodiment 500 shows a second or top BEOL layer or substrate 505 disposed on the bottom substrate 205. The top layer/substrate 505 can be thicker than the bottom substrate 205, between 100 nm and 1 micron (1000 nm) thick and made of the same or similar materials as the bottom substrate 205.

A via 550 (interconnect via) penetrates the top layer/substrate 505; the capping layer 210; and the residual contact/electrode (120, 130) material, and/or the dielectric material 125 (if any) on the surface of the 310 of the capping layer 210 to make electrical and physical contact with the interconnect 105. The via 550 also penetrates the capping layer 510 of the top layer/substrate 505 to provide an external electrical connection 550 to the interconnect 105. The via 550 is made of known electrically conductive material, copper, which can be covered in a barrier layer 555, similar to barrier layer 110.

A second via 560 penetrates the top substrate 505 and the barrier layer 510 to make electrical contact with the internal connection/electrode 130 of the PRAM 115. A barrier layer 565 can surround this via 560 as well to prevent migration of materials in the via 560 from migrating.

The RRAM 115 can protrude a protrusion distance 515 above the surface of the lower substrate 105. This protrusion distance 515 can vary depending on the design. For example, the protrusion distance 515 can be zero so the via 565 would need to be longer, e.g. as long as the thickness of the top substrate 505, to make contact with the internal connection/electrode 130. Alternatively, the protrusion distance 515 can be the thickness of the top substrate 505, eliminating the need for the via 560. In this case an interconnection (e.g. an interconnect or via from an upper layer) can be made directly to the internal connection/electrode 130 at the top surface of the top substrate 505. In other embodiments where the protrusion distance 515 puts the internal connection 130 within the top substrate 505, an interconnection going through (e.g. horizontally into the figure and not shown) substrate 505 can make electrical contact with the top of internal connection 130 of the RRAM 115. The protrusion distance 515 depends on how connections are made to the internal connection 130 of the RRAM 115.

An example of view D-D 538 is shown in FIG. 1A.

FIG. 6A is an elevation cross section view of a preliminary structure 600 including a bottom BEM layer/substrate 205 and a top BEOL layer/substrate 505 with a single interconnect 105 in the bottom Man: layer 205.

In some embodiments, the lower substrate 205 is thinner (e.g. between 40 nm and 100 nm) than the upper substrate 505 (with a thickness between 100 nm and 1000 nm). A single RRAM 115 having a height of between 10 nm to 50 nm may have difficulty fitting entirely within the lower substrate 205. In some embodiments, all or part of the RRAM 115 sits within a trench 625 dispose in the lower substrate 205 with the external electrode/connection 120 making connection to the interconnection 105 side 107 instead of the top 605 or bottom 606 of the interconnect 105. This enables placement of the RRAM 115 in thinner layers/substrates 205, with higher density interconnections, made at the BEM.

FIG. 6B is an elevation cross section view of the preliminary structure 650 of FIG. 6A with a trench 625 through the top BEM, layer 505, into (disposed in) the bottom BEM layer 205, and adjacent to the interconnect side 107 of the interconnect 105. The trench 625 is made using known techniques as described above.

Figure 7:
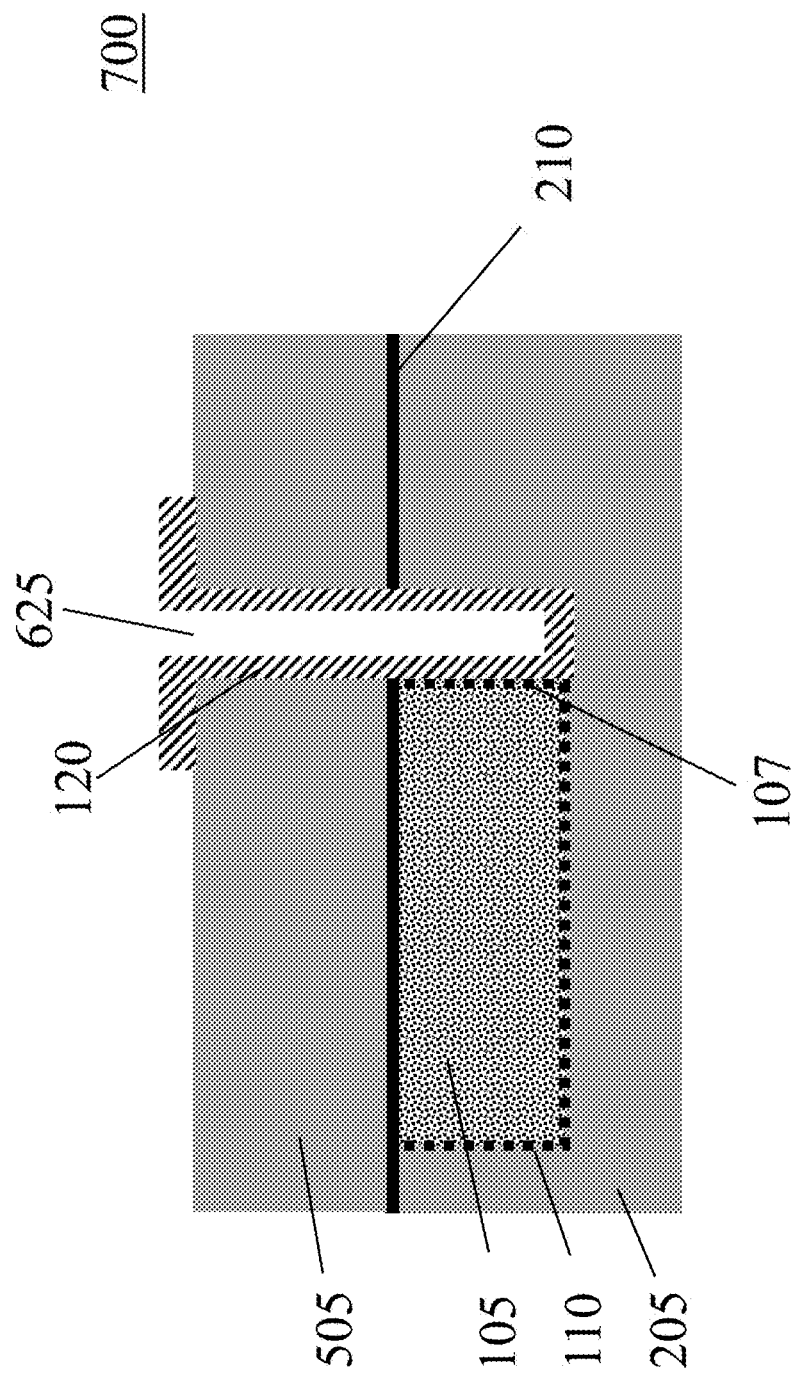
FIG. 7 is an elevation cross section view of the preliminary structure of FIG. 6B after an external contact/electrode deposition.

FIG. 7 is an elevation cross section view of the preliminary structure 700 of FIG. 6B after an external contact 120 deposition. The external contact 120 deposition is done with materials and methods as described but into a trench 625 that penetrates both the top substrate/layer 505 and bottom layer 205.

Figure 8:
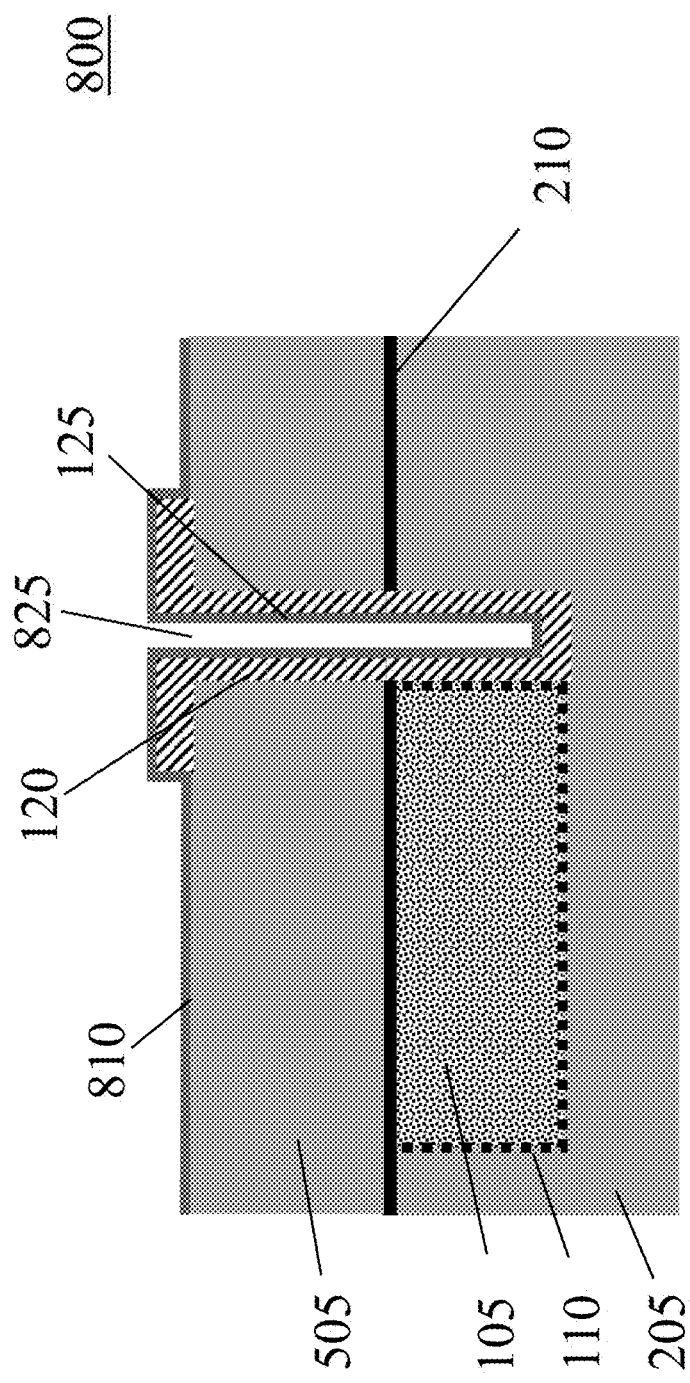
FIG. 8 is an elevation cross section view of the preliminary structure after a high k dielectric deposition.

FIG. 8 is an elevation cross section view of the preliminary structure 800 after a high k dielectric 125 deposition. The materials and methods are as previously described for this deposition. A trim step removing the excess high k dielectric 125 from the surface capping layer-not shown) 810 of the upper substrate 505 can be performed. After deposition of the external contact 120 and the dielectric layer 125, there is a smaller opening 825 remaining of the trench 625.

Figure 9:
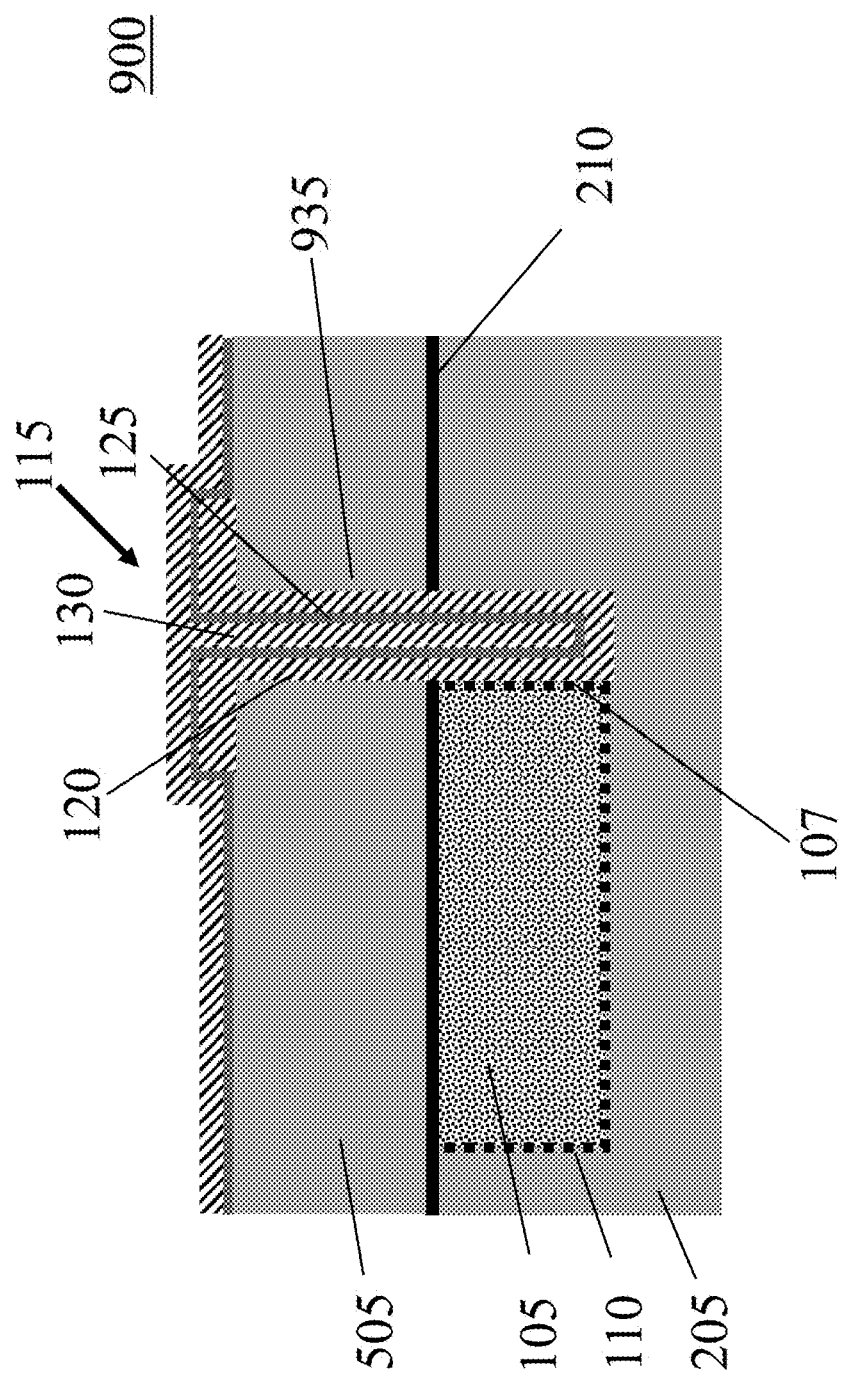
FIG. 9 is an elevation cross section view of one embodiment of a completed single RRAM (via connections not shown) with an external contact/electrode adjacent and connected to a single interconnect.

FIG. 9 is an elevation cross section view of one embodiment 900 of a completed single RRAM 115 (via connections to interconnect 105 not shown) with an external contact 120 adjacent to and connected with the side 107 of the single interconnect 105.

Building of the single RRAM 115 is completed with deposition of the internal connection/electrode 130 by using materials and methods described above.

In this embodiment, the single RRAM 115 extends 935 through the upper substrate 505 so that the internal connection/electrode 130 is exposed to contact any interconnection above the upper substrate 505 without the need of a via through the upper substrate 505. The height of the IMAM 115 is greater than the thickness of the upper substrate 505.

Figure 10:
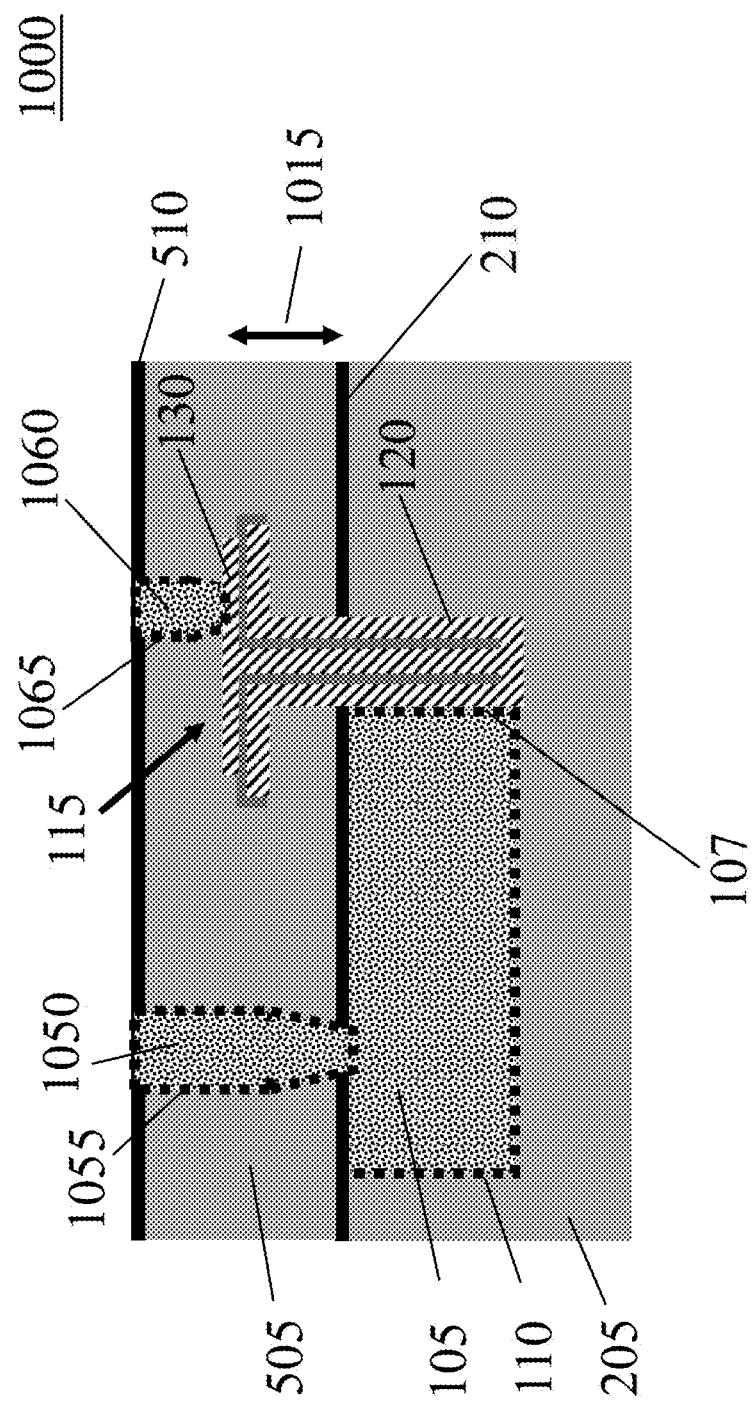
FIG. 10 is an elevation cross section view of one alternative embodiment of a completed single RRAM with an external contact/electrode adjacent and connected to an interconnect.

FIG. 10 is an elevation cross section view of one alternative embodiment 1000 of a completed single RRAM 115 with an external contact/electrode 120 adjacent and connected to an interconnect side 107 of an interconnect 105.

A via 1050 (interconnect via) penetrates the top layer/substrate 505, capping layer 510, and capping layer 210 to make electrical and physical contact with the interconnect 105 and to provide an external electrical connection to the interconnect 105. The via 1050 is made of known electrically conductive material, e.g. copper, which can be covered in a barrier layer 1055.

In this embodiment, the height 1015 of the single RRAM 115 protruding above the capping layer 210 of the lower substrate 205, protrusion distance 1015, is not large enough for the RRAM 115 to penetrate through the upper substrate 505 to expose the internal connection/electrode 130 above the upper substrate 505.

In some embodiments, a second via 1060, an RRAM via 1060, penetrates the top substrate 505 to make electrical contact with the inner connection 130 of the RRAM 115. A barrier layer 1065 can surround this via 1060 to prevent migration of materials making the via 1060 from migrating.

In some embodiments, e.g. in a dual damascene process, the structure (1050, 1055) can be a known combination of an interconnection/line and a via. Further, the structure (1060, 1065) will not be a via but an interconnection/line (1060, 1065). In these embodiments, the protrusion distance 1015 will be the distance required make contact between the internal contact/electrode 130 and the interconnection/line (1060, 1065).

In alternative embodiments, an interconnect (not shown) running above the upper substrate 505 (e.g. horizontally into the figure) will make electrical contact with the external contact/electrode 130 though the via 1060. The protrusion distance 1015 is determined by how the external contact/electrode 130 is made to contact upper level electrical connections.

Figure 11:
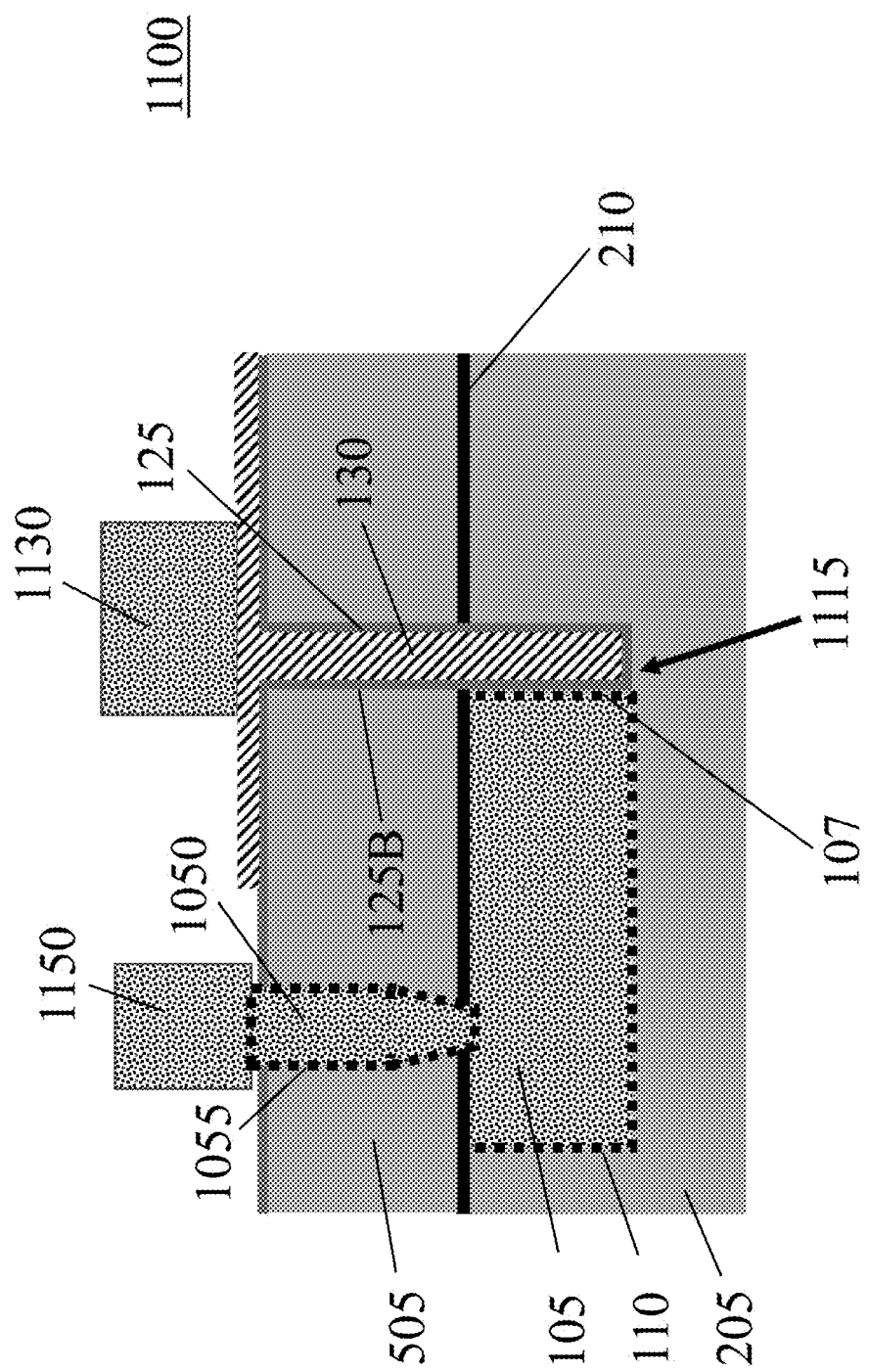
FIG. 11 is an elevation cross section view of another alternative embodiment of a completed single RRAM with no external contact/electrode and a single interconnect connected directly to the high k dielectric.

FIG. 11 is an elevation cross section view of another alternative embodiment 1100 of a completed single RRAM 1115 with no external contact/electrode 120 and a single interconnect 105 connected directly to the high k dielectric 125.

This embodiment 1100 creates the single RRAM 1115 beginning with the preliminary structure 650 in FIG. 6B and omitting the step of depositing the external contact/electrode 120 as described in FIG. 7. The steps described in FIGS. 8 and 9 are performed. In this embodiment, the barrier layer 110 covering the interconnect 105 performs the function of external contact/electrode. The interconnect side 107 connects directly to the external dielectric side 125B.

Connections 1150 and 1130 can be external contacts to the interconnect 105 and internal electrode 130, respectively. Alternatively, connections 1150 and 1130 can be interconnections/lines in a layer (not shown) above the upper substrate 505.

Figure 12A:
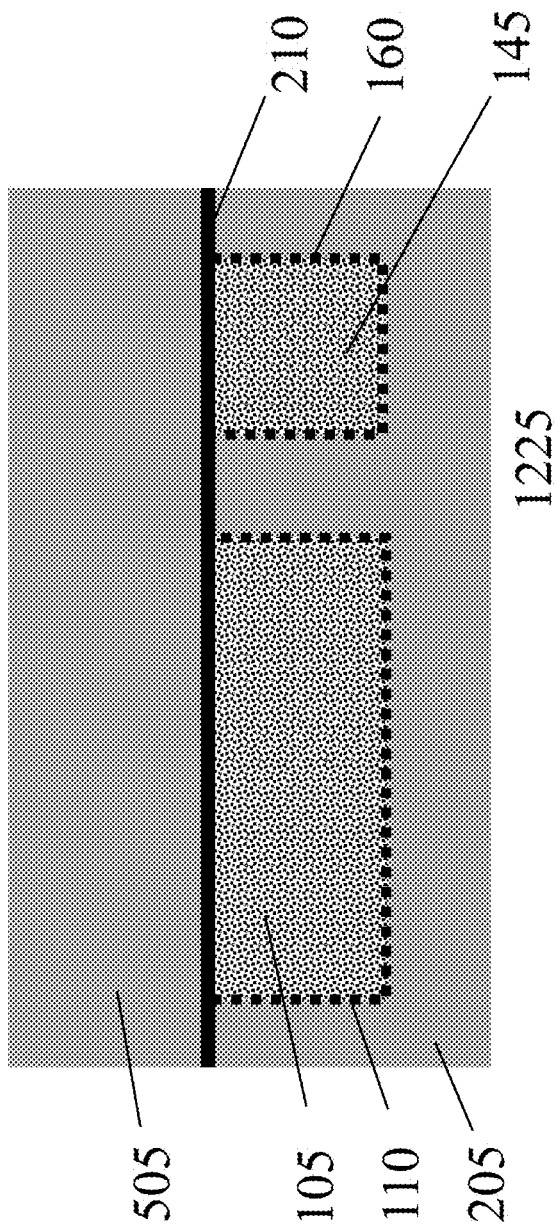
FIG. 12A is an elevation cross section view of a preliminary structure including a bottom BEOL layer/substrate and a top BEOL layer/substrate with a first and second interconnect in the bottom BEOL layer.

FIG. 12A is an elevation cross section view of a preliminary structure 1200 including bottom BEOL layer/substrate 205 and a top BEOL layer/substrate 505 with a first 105 and second 145 interconnect in the bottom BEOL: layer 205. The first 105 and second 145 interconnect are made from the materials as described above. They can have barrier layers 110 and 160 respectively. A capping layer 210 as described above is disposed on the bottom layer/substrate 205 and is between the bottom layer/substrate 205 and top layer/substrate 505.

Figure 12B:
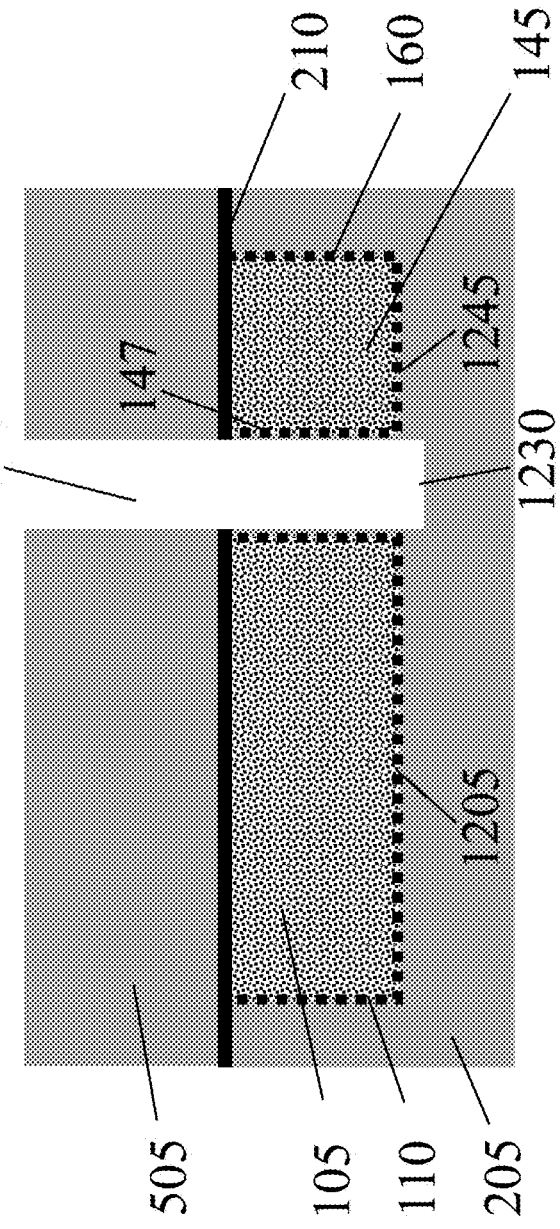
FIG. 12B is an elevation cross section view of the preliminary structure of FIG. 12A with a trench through the top BEM layer, disposed into the bottom BEOL layer, and between and adjacent to the sides of the first and second interconnects.

FIG. 12B is an elevation cross section view of the preliminary structure 1250 of FIG. 12A with a trench 1225 through the top layer/substrate 505, into (disposed in) the bottom layer/substrate 205, and between and adjacent to each of the interconnect sides (107, 147) of the first 105 and second 145 interconnects, respectively.

The trench 1225 is made using known methods as described above. In some embodiments, the bottom 1230 of the trench 1225 optionally extends below the interconnect bottoms (1205 and 1245, respectively) of the first 105 and second 145 interconnect.

Figure 13B:
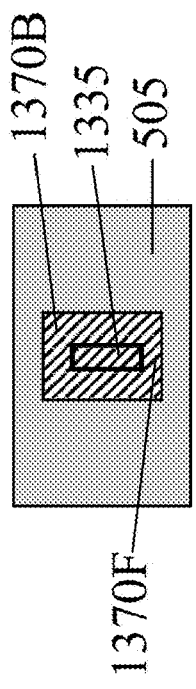
FIG. 13B is a top down view of FIG. 13A before some of the material of external contact deposition is removed.
Figure 13C:
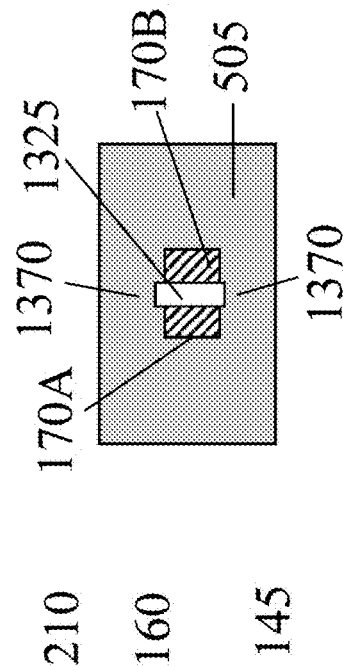
FIG. 13C is a top down view of FIG. 13A showing an electrical and physical separation of the external contact/electrode into two sides after external contact material is removed from front and back side walls and the bottom of the trench.
Figure 13A:
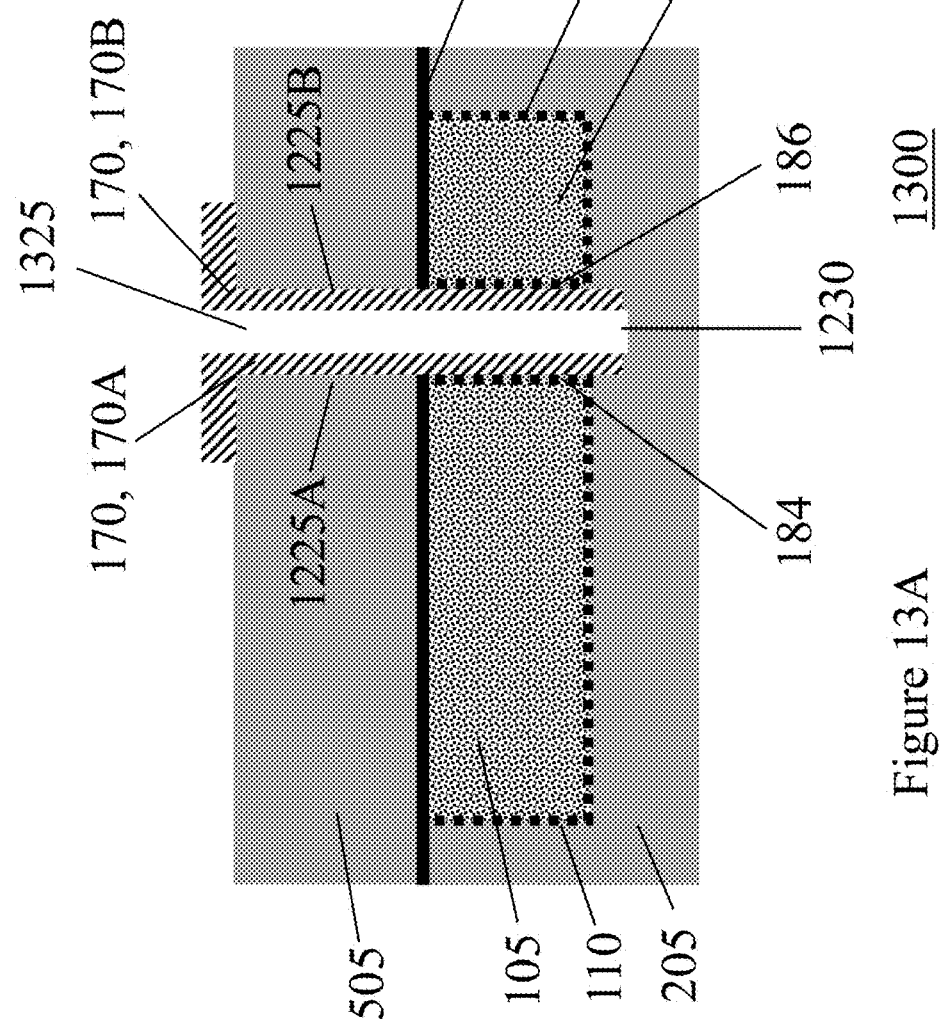
FIG. 13A is an elevation cross section view of the preliminary structure of FIG. 12B after an external contact/electrode deposition and external contact/electrode separation into two sides.

FIG. 13A is an elevation cross section view of the preliminary structure 1300 of FIG. 12B after an external contact 170 deposition and the separation of the external contact 170 into two sides (170A, 170B).

The external contact 170 is disposed within the trench 1225 using materials and methods described above for the deposition of the external contact 170. However, part of the external contact 170 is removed from the bottom 1230 of the trench 1225 and two sidewalls (front 1370F and back 1370B), e.g. by masking and a directional etch. The removal of external contact 170 material from the bottom 1230 and two sidewalls (front 1370 F and back 1370B) of the trench 1225 creates two physically and electrically, separate external contacts (170A, 170B) on opposite sides (1225A, 1225B) of the trench 1225. External contact 1701 is electrically and physically connected to a first interconnect side 184 of the first interconnect 105 and external contact 170B is electrically and physically connected to a second interconnect side 186 of the second interconnect 145. The first external contact/electrode 170A is not physically or electrically connected to the second external contact/electrode 170B.

FIG. 13B is a top down view 1335 of FIG. 13A before some of the material of external contact deposition (170, 1325) is removed. Initially, the external contact deposition fills the trench 1225 including the center trench region 1335, the front sidewall 1370F, the back sidewall 1370B, and the first 170A and second 170B external contact 170 sides.

FIG. 13C is a top down view 1350 of FIG. 13A showing an electrical and physical separation of the external contact 170 into two sides (170A, 170B) after external contact material is removed 1370 from the front 1370E and back 1370B side walls and the bottom 1230 of the trench 1225. As stated, this is done by performing masking and a directional etch. The original trench 1225 is narrowed by the external contacts (170A, 170B) deposited on the side walls of the original trench 1225 to create a narrower trench 1325.

Figure 14:
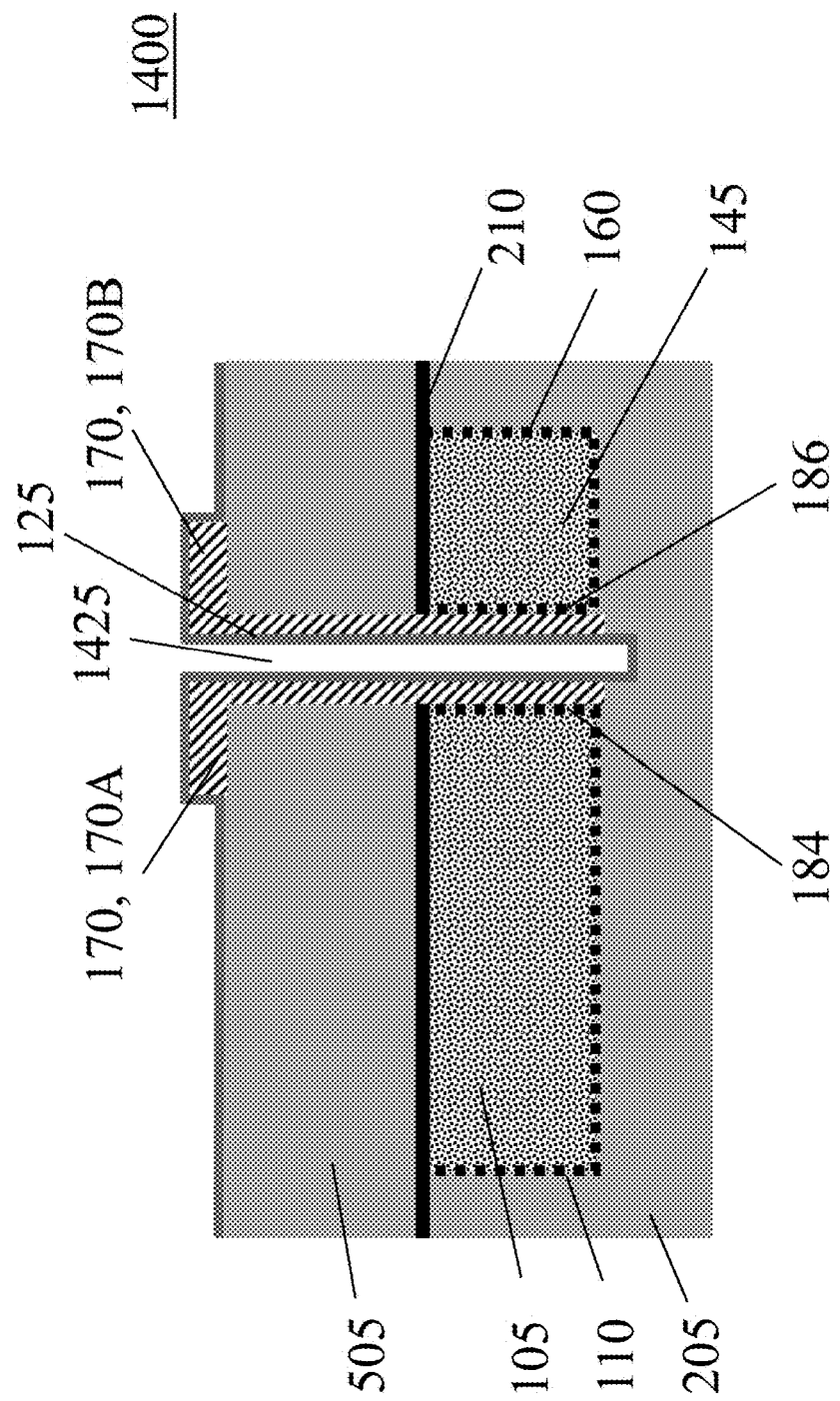
FIG. 14 is an elevation cross section view of the preliminary structure of FIG. 13A after a high k dielectric deposition.

FIG. 14 is an elevation cross section view of the preliminary structure 1400 after a high k dielectric 125 deposition.

The materials and methods use for the high k dielectric 125 deposition are as previously described. A trim step removing the high k dielectric 125 from the surface (or capping layer-not shown) of the upper substrate 505 can be performed. After deposition of the external contact 170 and the dielectric layer 125, there is a smaller opening 1425 created in the trench 1325 which is narrowed further by the high k dielectric 125 deposition.

FIG. 15 is an elevation cross section view of one embodiment 1500 of a completed dual, three-wire RRAM 175 with an external contact via (1550A, 1550B) connected to each of the first 105 and second 145 interconnects, respectively. There is a common internal contact/electrode (1530, 130).

The internal contact/electrode material (130, 1530) is deposited and fills the opening 1425 remaining of the trench 1225. Some of the internal contact/electrode (130, 1530) material optionally remains covering the dual RRAM 175. A trim step can remove the internal contact/electrode (130, 1530) material from the rest of the top surface of the structure 1500. The internal contact/electrode material (130, 1530) cannot be in electrical contact with the external contact/electrode 170 or the external contact vias (1550A, 1550B).

A first via 1550A (first interconnect via) penetrates the top layer/substrate 505 and the capping layer 210 to make electrical and physical contact with the first interconnect 105. The first via 1550A also penetrates any capping layer (not shown) on the top layer/substrate 505 to provide an external electrical connection 1550A to the interconnect 105.

A second via 1550B (second interconnect via) penetrates the top layer/substrate 505 and the capping layer 210 to make electrical and physical contact with the second interconnect 145. The second via 1550B also penetrates any capping layer (not shown) on the top layer/substrate 505 to provide an external electrical connection 1550B to the interconnect 145.

The vias 1550 are made of known electrically conductive material, e.g. copper, and each via 1550 can be covered in a barrier layer 1555. Damascene structures as described above can also be used.

A voltage applied across the common connection (130, 1530) and the first interconnect via 1550A can cause the first high k dielectric 170A to set/reset because of the connection through the first interconnect 105, first interconnect side 184, and first external connection 170A.

A voltage applied across the common connection (130, 1530) and the second interconnect via 1550B can cause the first high k dielectric 170B to set/reset because of the connection through the second interconnect 145, second interconnect side 186, and second external connection 170B.

Accordingly, the dual RRAM 175 has two independently controlled RRAMs (175A and 175B) because the first 170A and second 170B external connections/electrodes are not electrically connected to one another or to the common internal connection/electrode (130, 1530).

An example top down view E-E 1598 is shown in FIG. 1C.

Figure 16:
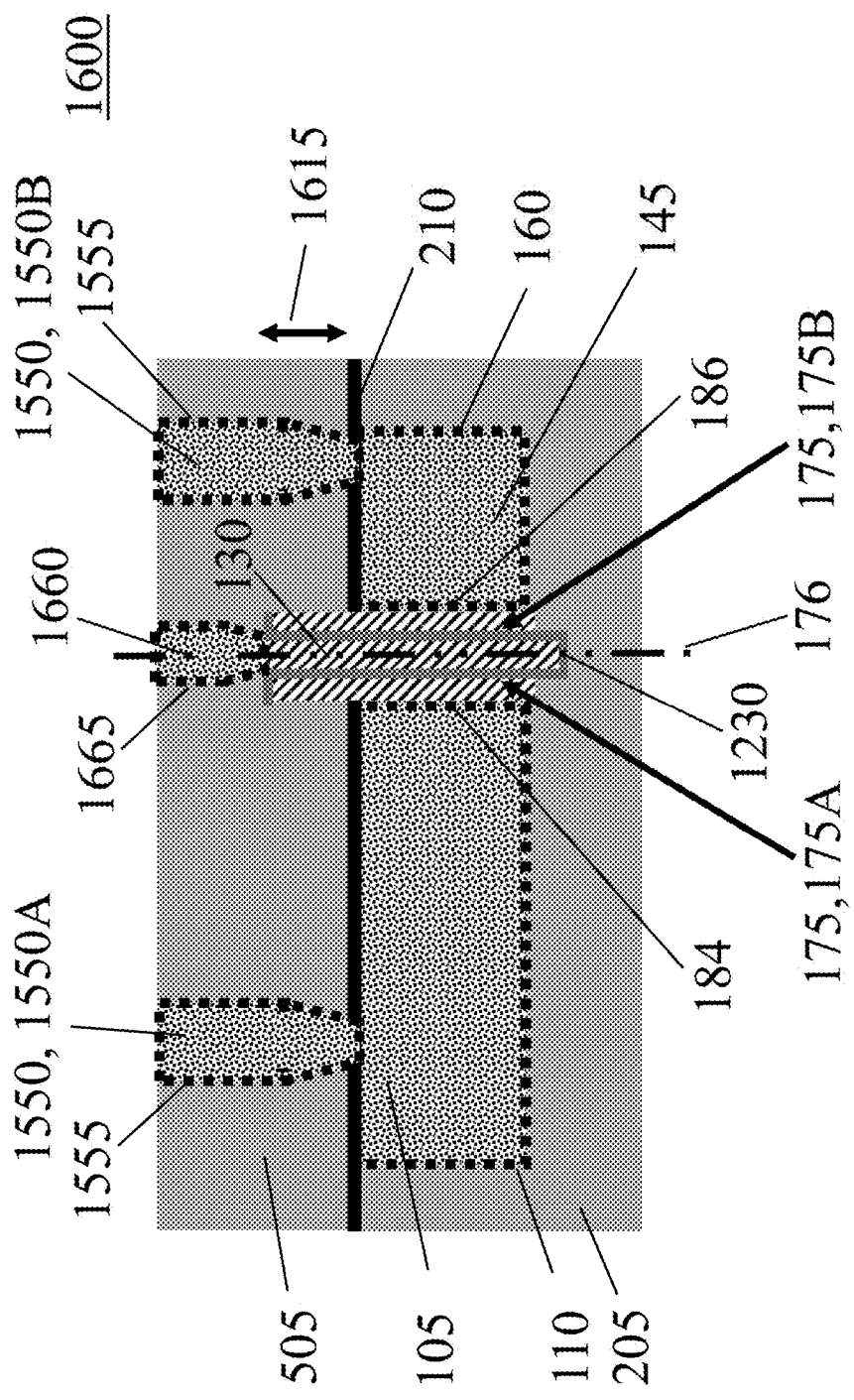
FIG. 16 is an elevation cross section view of an alternative embodiment of a completed dual, three-wire RRAM with external via contacts connected to a first and second interconnect, respectively, and with a common via connected to a common internal connection/electrode.

FIG. 16 is an elevation cross section view of an alternative embodiment 1600 of a completed dual, three-wire RRAM 1600 with external via contacts 1550 (1550A, 1550B) connected to a first 105 and second 145 interconnect, respectively, and with a common via 1660 connected to a common internal connection/electrode 130.

In this embodiment 1600 of the dual RRAM 175 (with center line 176), the dual RRAM 175 is not long enough to extend to the surface of the upper substrate 505. The dual RRAM 175 extends above the capping layer 210 of the lower substrate 205 by a protrusion distance 1615. In one embodiment, common via 1660 penetrates the upper substrate 505 to electrically contact the inner contact/electrode 130 of the dual RRAM 175 and provide an external connection above the surface of the upper substrate 505.

In alternative embodiments, an interconnect (not shown) running within the upper substrate 505 (e.g. horizontally into the figure) will make electrical contact with the external contact/electrode 130. The protrusion distance 1615 is determined by how the external contact/electrode 130 is made to upper level electrical connections.

A barrier layer 1665 can surround the common via 1660 to prevent materials in the common via 1660 from migrating. Damascene structures, as described above, are also envisioned.

FIG. 17 is an elevation cross section view of another alternative embodiment 1700 of a completed dual IMAM 150 with no external contact/electrode (120, 170). The first interconnect 105 side 184 is connected directly the external dielectric side 125B of a first dielectric side 135 of the dielectric layer 125. The second interconnect 145 side 186 is connected directly to the external dielectric side 125B of the second dielectric side 155 of the dielectric layer 125. There is a common internal connection/electrode (130,1730).

This embodiment 1700 of the dual RRAM 150 begins with the preliminary structure 1250 in FIG. 12B and omits the step of depositing the external contact/electrode 170 as described in FIG. 13. The steps described in FIGS. 14 and 15 are performed. In this embodiment, the barrier layers 110 and 160 covering the interconnects (105 145), respectively, perform the function of external contact/electrode.

Figure 18:
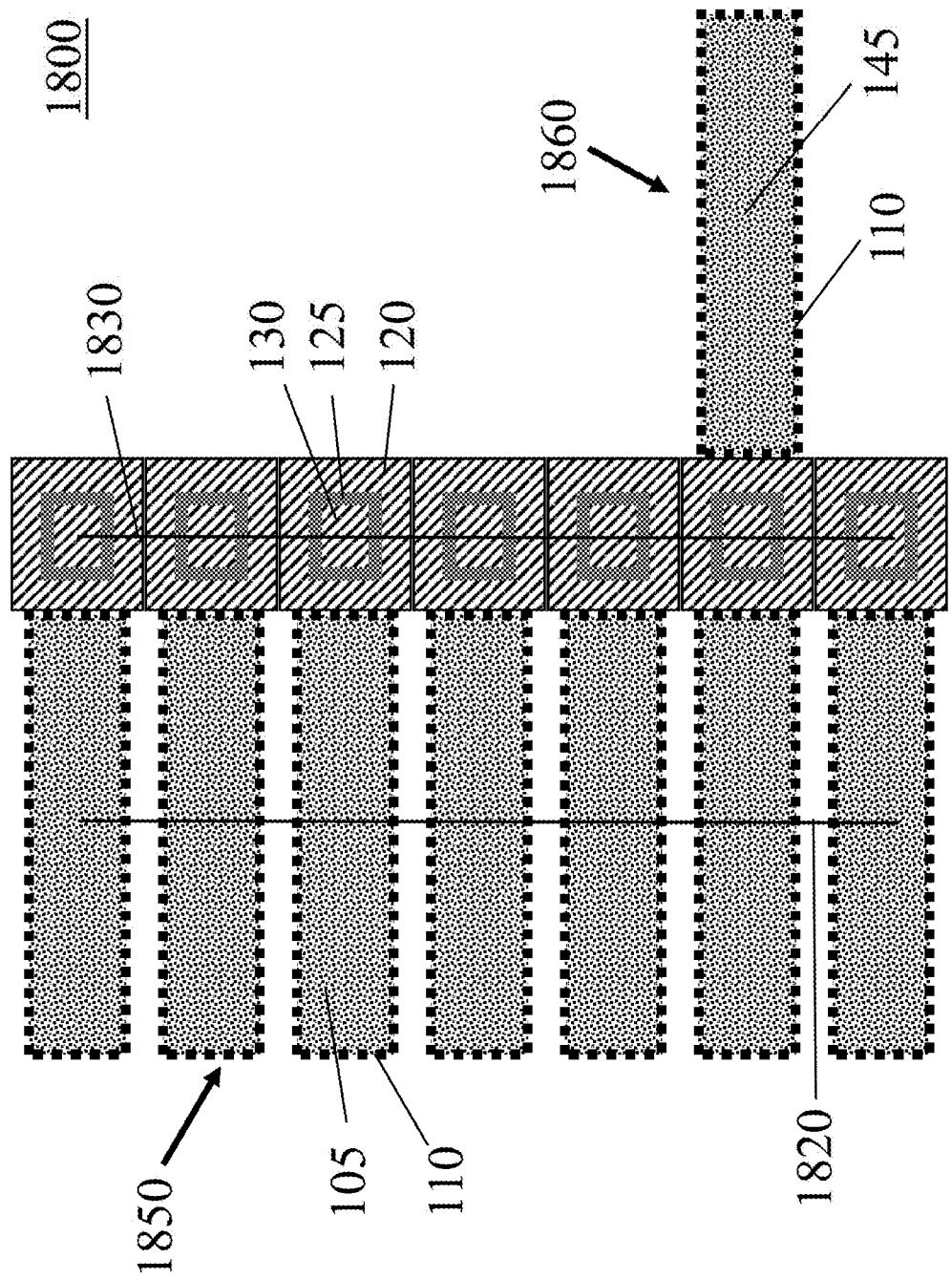
FIG. 18 is a top down view of a RRAM array.

An example of view F-F 1778 is shown in FIG. 1B,

FIG. 18 is a top down view of various embodiments of a RRAM array 1800.

RRAM cell 1850 can be any embodiment of a single RRAM that would become evident to one skilled in the art given this disclosure including but not limited to single RRAMs 100, 400, 500, 900, 1000, and 1100.

RRAM cell 1850 also can be any embodiment of a dual RRAM that would become evident to one skilled in the art given this disclosure including but not limited to dual RRAMs 1500, 1600, and 1700.

Any of these embodiments can be combined to create a RRAM array 1800. In some embodiments, RRAMs a single type are used to create the RRAM array 1800 due to manufacturing and/or application considerations.

While embodiments of the RRAMs shown have an external contact/electrode 120, dielectric layer 125, and internal dielectric layer 130, embodiments are contemplated where there is no external contact/electrode (120, 170).

In some RRAM array embodiments, the RRAM cells (1850, 1860) are arranged adjacently to one another as shown in FIG. 18. Other arrangements are envisioned.

In some embodiments, one of the electrodes of each of the RRAM cells (1850, 1860) is connected in common with the same electrode of each of the other RRAM cells (1850, 1860).

For example, if all the RRAM cells 1850 are single RRAMs, all the internal contacts/electrodes 130 can be connected in common by a wire or an interconnect 1830 in a layer. Alternatively, to connect all the external contacts/electrodes 120 together, a wire or an interconnect 1820 in a layer can connect all the interconnects 105 together electrically, e.g. by connecting all the vi as in contact with the interconnects 105.

In other embodiments where all the RRAM cells 1860 are dual RRAM cells, all the internal contacts/electrodes 130 can be connected 1830 in common. Alternatively, all the first external connections/electrodes 170A can be connected by connecting the first interconnections (105, 1550A) together and/or all the second external connections/electrodes 170B can be connected by connecting the second interconnections (145, 1550B) together.

When a cell is used as RRAM device, a Set/Reset function is needed to form filaments. However, note that embodiments of these cells are also capacitors. Therefore, as capacitors, each of these cells can be used for regular memory functions, i.e. by charging/discharging the capacitors without the need of filament formation. It is envisioned that the structures and methods disclosed in this disclosure can function as memory devices like Dynamic Random-Access Memory (DRAM).

FIG. 19 is a flow chart of a process of making one or more RRAM in the BEOL.

Step 1905 begins the process 1900 passing (disposing) the trench (225, 625, 1225) into the lower substrate 205 including passing the trenches though the upper substrate 505 as explained above for the different embodiments.

Step 1910 is the deposition of external electrode 120 within the trench. This step 1910 is not performed for embodiments with no external electrode 120, e.g. the embodiments shown in FIGS. 11 and 17.

Step 1915 deposits the high k layer 125 in the trench. Depending on the embodiment being built, the high k layer 125 makes direct contact with the interconnect sides (107, 147) or with the external electrode (120, 170).

Step 1920 deposits the internal electrodes (130, 1530, 1730).

Step 1925 makes the electrical connects, e.g. with vias (550, 560, 1050, 1060, 1550, 1550A, 1550B, 1530, and 1660).

Step 1930 enables the creation of embodiments of arrays of RRAM where there are multiple single RRAMs and/or dual RRAMs on the substrates, as discussed above. Connections include connecting the interconnects (105, 145) with connector 1820 or connecting the internal electrodes (130, 1530, 1730) with connector 1830. Known connection methods can be used.

The descriptions of the various embodiments of the present invention have been presented for purposes of illustration but are not intended to be exhaustive or limited to the embodiments disclosed. Given this disclosure, many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A Resistive Random-Access Memory (RRAM) comprising:
    an internal electrode;
    a high k dielectric layer surrounding and in contact with the internal electrode, the high k dielectric layer having an external dielectric side not in contact with the internal electrode;
    a lower substrate;
    a trench having two or more trench sides, the trench disposed in the lower substrate, the internal electrode and the high k dielectric layer being disposed within the trench and the internal electrode and the high k dielectric layer protruding a protrusion distance above the lower substrate;
    an upper substrate disposed on the lower substrate and disposed over at least part of the internal electrode and high k dielectric layer protruding the protrusion distance above the lower substrate and into the upper substrate; and
    an interconnect within the lower substrate, the interconnect having an interconnect top, and interconnect bottom, and an interconnect side, the interconnect side being part of one of the trench sides,
    wherein the interconnect side is in contact with the external dielectric side of the high k dielectric layer within the trench, and
    wherein the protrusion distance is large enough so the internal electrode and the high k dielectric layer protrude through the upper substrate.

2. A RRAM, as in claim 1, where the internal electrode is made from one or more of the following: Titanium Nitride (TiN), Tantalum Nitride (TaN), a metal, copper (Cu), aluminum (Al), and tungsten (W).

3. A RRAM, as in claim 1, where the high k dielectric layer is made from one or more of the following: a high-k dielectric material, Hafnium Oxide ($HfO_x$), Tantalum Oxide ($TaO_x$), Aluminum Oxide ($Al_2O_3$), Zirconium Oxide (ZrOx), and Titanium Oxide ($TiO_x$).

4. A RRAM, as in claim 1, the interconnect side is in contact with the external dielectric side of the high k dielectric layer through an external electrode disposed between the interconnect side and the high k dielectric layer.

5. A RRAM, as in claim 4, where the external electrode surrounds the high k dielectric layer and is in electrical contact with the interconnect side and the high k dielectric layer.

6. A RRAM, as in claim 1, where an interconnect via protrudes through the upper substrate to make contact with the interconnect.

7. A RRAM, as in claim 1, further comprising an external electrode disposed between the interconnect side and the high k dielectric layer, the external electrode forming an electrical connection between the high k dielectric layer and the interconnect side.

8. A dual Resistive Random-Access Memory (RRAM) comprising:
    an internal electrode;
    a high k dielectric layer surrounding and in contact with the internal electrode, the high k dielectric layer having an external dielectric side not in contact with the internal electrode, the high k dielectric layer further having a first dielectric side and a second dielectric side;
    a lower substrate;
    an upper substrate disposed on the lower substrate;
    a trench having a first trench side and a second trench side, the trench passing through the upper substrate and disposed in the lower substrate;
    a first interconnect within the lower substrate, the interconnect having a first interconnect side;
    a second interconnect within the lower substrate, the second interconnect having a second interconnect side, the trench being between the first interconnect side and the second interconnect side, the first interconnect side being part of the first trench side, and the second interconnect side being part of the second trench side, and the first interconnect side and the second interconnect side not being electrically connected,
    wherein the internal electrode and the high k dielectric layer are disposed within the trench and the external dielectric side of the first dielectric side of the dielectric layer is electrically and physically connected to first interconnect side and the external dielectric side of the second dielectric side of the dielectric layer is electrically and physically connected to the second interconnect side.

9. A dual RRAM, as in claim 8, further comprising:
    a first external electrode electrically and physically connects the first interconnect side and the external dielectric side of the first dielectric side of the dielectric layer; and
    a second external electrode electrically and physically connects the second interconnect side and the external dielectric side of the second dielectric side of the dielectric layer,
    wherein the first external electrode and the second external electrode are not electrically connected.

* * * * *